United States Patent
Chen et al.

(10) Patent No.: US 11,211,470 B2
(45) Date of Patent: Dec. 28, 2021

(54) SEMICONDUCTOR DEVICE AND METHOD

(71) Applicant: Taiwan Semiconductor Manufacturing Company, Ltd., Hsinchu (TW)

(72) Inventors: Meng-Ku Chen, New Taipei (TW); Chii-Horng Li, Zhubei (TW); Cheng-Po Chau, Tainan (TW); Pei-Ren Jeng, Chu-Bei (TW); Yee-Chia Yeo, Hsinchu (TW); Chia-Ao Chang, Jinhu Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/657,439

(22) Filed: Oct. 18, 2019

(65) Prior Publication Data

US 2021/0119013 A1   Apr. 22, 2021

(51) Int. Cl.
| | |
|---|---|
| *H01L 29/66* | (2006.01) |
| *H01L 21/28* | (2006.01) |
| *H01L 21/285* | (2006.01) |
| *H01L 21/762* | (2006.01) |

(52) U.S. Cl.
CPC .. *H01L 29/66545* (2013.01); *H01L 21/28556* (2013.01); *H01L 21/76224* (2013.01)

(58) Field of Classification Search
CPC ......... H01L 29/66545; H01L 21/28556; H01L 21/76224
USPC ........................................................ 438/424
See application file for complete search history.

(56) References Cited

U.S. PATENT DOCUMENTS

| | | | | |
|---|---|---|---|---|
| 6,225,221 B1 * | 5/2001 | Ho | .................... | H01L 21/76843 438/637 |
| 10,263,108 B2 | 4/2019 | Tsai et al. | | |
| 10,332,746 B1 * | 6/2019 | Yu | ....................... | H01L 21/0262 |
| 10,868,140 B2 | 12/2020 | Yu et al. | | |
| 2004/0071879 A1 * | 4/2004 | Callegari | .............. | H01L 29/513 427/255.28 |
| 2005/0023686 A1 * | 2/2005 | Lin | ................... | H01L 21/76873 257/751 |
| 2007/0120156 A1 * | 5/2007 | Liu | ................... | H01L 29/66795 257/288 |
| 2011/0143529 A1 * | 6/2011 | Lee | ................... | H01L 21/28185 438/591 |
| 2011/0237046 A1 * | 9/2011 | Maszara | ........... | H01L 29/66795 438/424 |
| 2012/0049294 A1 * | 3/2012 | Chen | ............... | H01L 21/823431 257/401 |

(Continued)

FOREIGN PATENT DOCUMENTS

| | | |
|---|---|---|
| TW | 201608643 A | 3/2016 |
| TW | 201916115 A | 4/2019 |
| TW | 201939586 A | 10/2019 |

*Primary Examiner* — Sheikh Maruf
(74) *Attorney, Agent, or Firm* — Slater Matsil, LLP

(57) ABSTRACT

An improved dummy gate and a method of forming the same are disclosed. In an embodiment, the method includes depositing a first material in a trench, the trench being disposed between a first fin and a second fin; etching the first material to expose an upper portion of sidewalls of the trench; and depositing a second material on the first material without the second material being deposited on the exposed upper portion of the sidewalls of the trench.

20 Claims, 23 Drawing Sheets

(56) References Cited

U.S. PATENT DOCUMENTS

| | | | |
|---|---|---|---|
| 2012/0091511 A1* | 4/2012 | Chen | H01L 29/772 257/213 |
| 2012/0273899 A1* | 11/2012 | Wann | H01L 23/48 257/401 |
| 2013/0026578 A1* | 1/2013 | Tsau | H01L 29/66545 257/368 |
| 2013/0045580 A1* | 2/2013 | Cho | H01L 21/76224 438/296 |
| 2013/0234203 A1* | 9/2013 | Tsai | H01L 29/66795 257/190 |
| 2014/0084340 A1* | 3/2014 | Wang | H01L 29/0684 257/190 |
| 2014/0103450 A1* | 4/2014 | Cheng | H01L 29/0653 257/401 |
| 2014/0124842 A1* | 5/2014 | Wang | H01L 29/7848 257/288 |
| 2014/0227858 A1* | 8/2014 | Shen | H01L 21/76229 438/430 |
| 2014/0315371 A1* | 10/2014 | Cai | H01L 21/76232 438/424 |
| 2015/0024573 A1* | 1/2015 | Jacob | H01L 29/66628 438/424 |
| 2015/0200128 A1* | 7/2015 | Jacob | H01L 21/823821 438/424 |
| 2015/0214341 A1* | 7/2015 | Shin | H01L 29/7851 257/401 |
| 2016/0005617 A1* | 1/2016 | Wu | H01L 21/31144 438/702 |
| 2016/0064529 A1* | 3/2016 | Huang | H01L 21/2855 438/157 |
| 2016/0087040 A1* | 3/2016 | Mao | H01L 29/66636 438/199 |
| 2016/0190019 A1* | 6/2016 | Yang | H01L 21/82345 438/592 |
| 2016/0336234 A1* | 11/2016 | Kim | H01L 21/823431 |
| 2017/0110375 A1* | 4/2017 | Bao | H01L 21/823842 |
| 2017/0323794 A1* | 11/2017 | Anderson | H01L 29/66666 |
| 2017/0352559 A1* | 12/2017 | Liu | H01L 21/67063 |
| 2018/0068903 A1* | 3/2018 | Adusumilli | H01L 21/26513 |
| 2018/0102294 A1* | 4/2018 | Bao | H01L 27/092 |
| 2019/0164969 A1* | 5/2019 | Leib | H01L 21/76816 |
| 2020/0052089 A1* | 2/2020 | Yu | H01L 21/823437 |

* cited by examiner

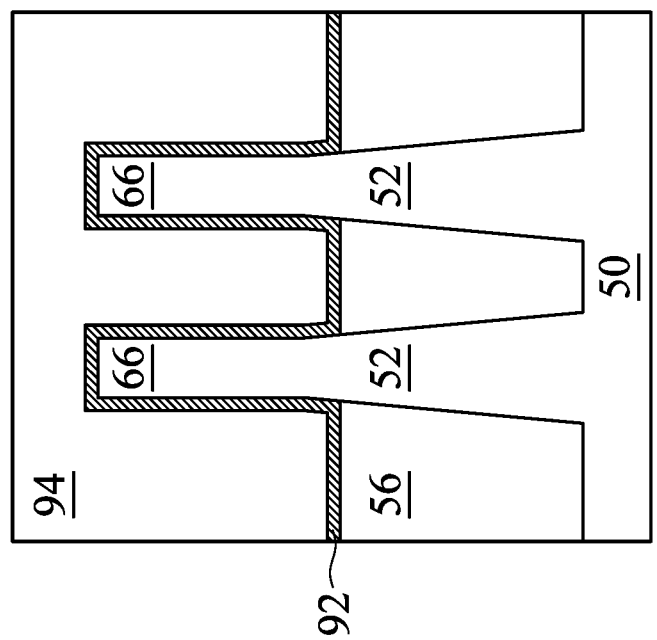
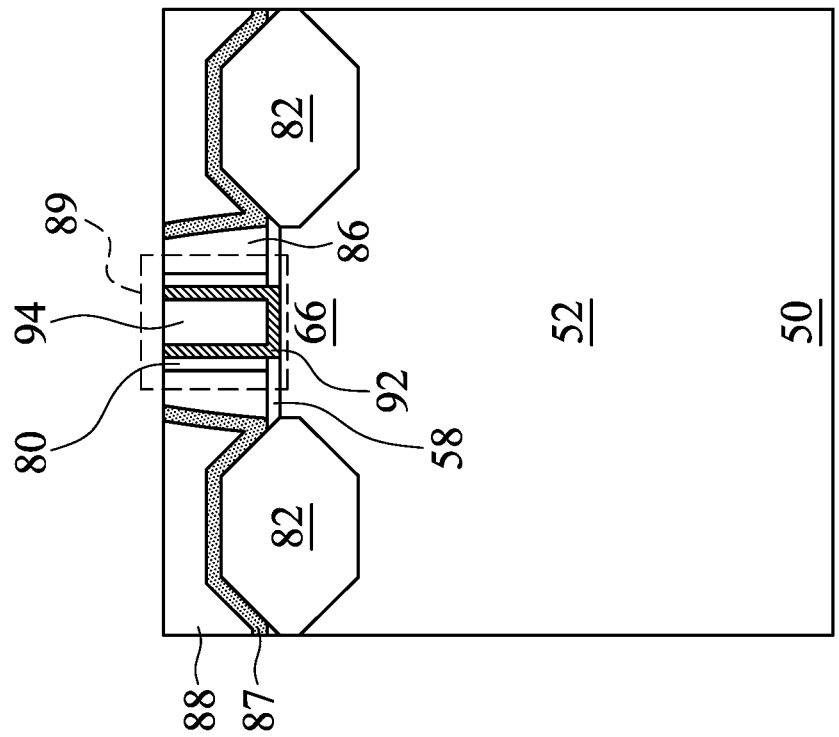
Figure 17A
Figure 17B

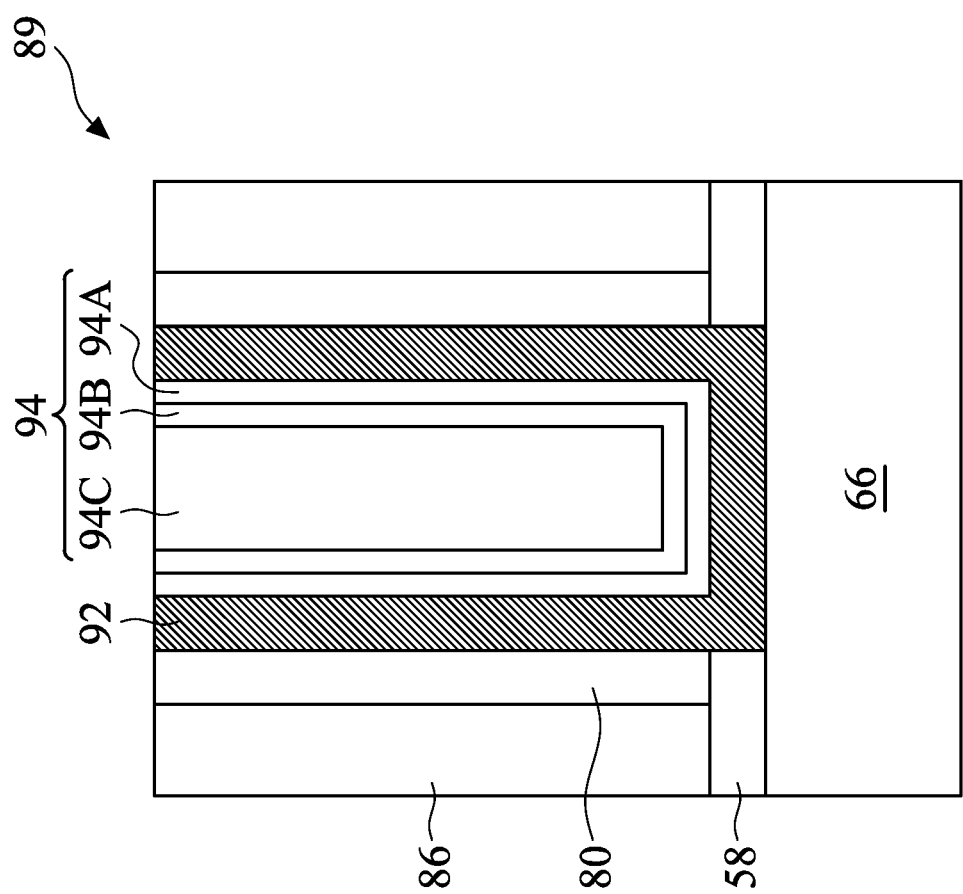

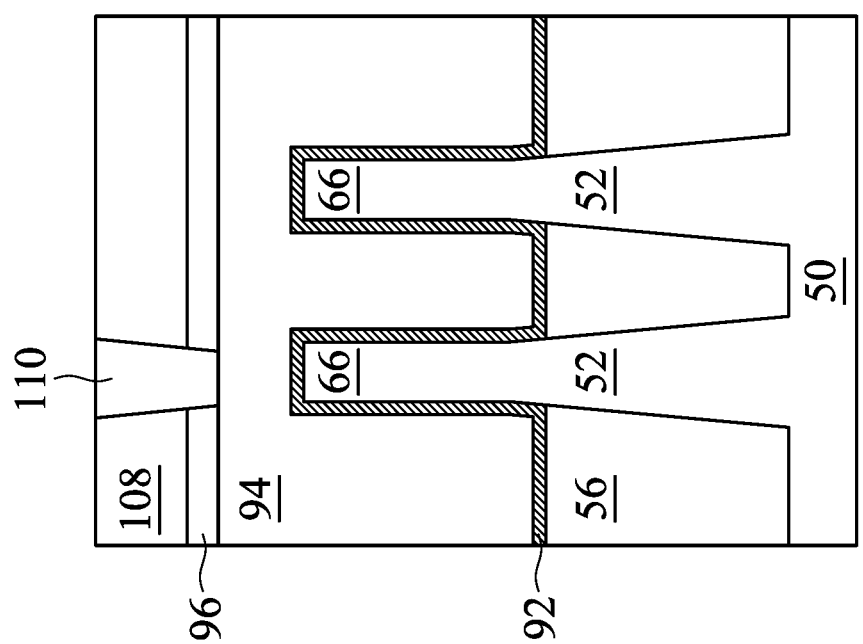
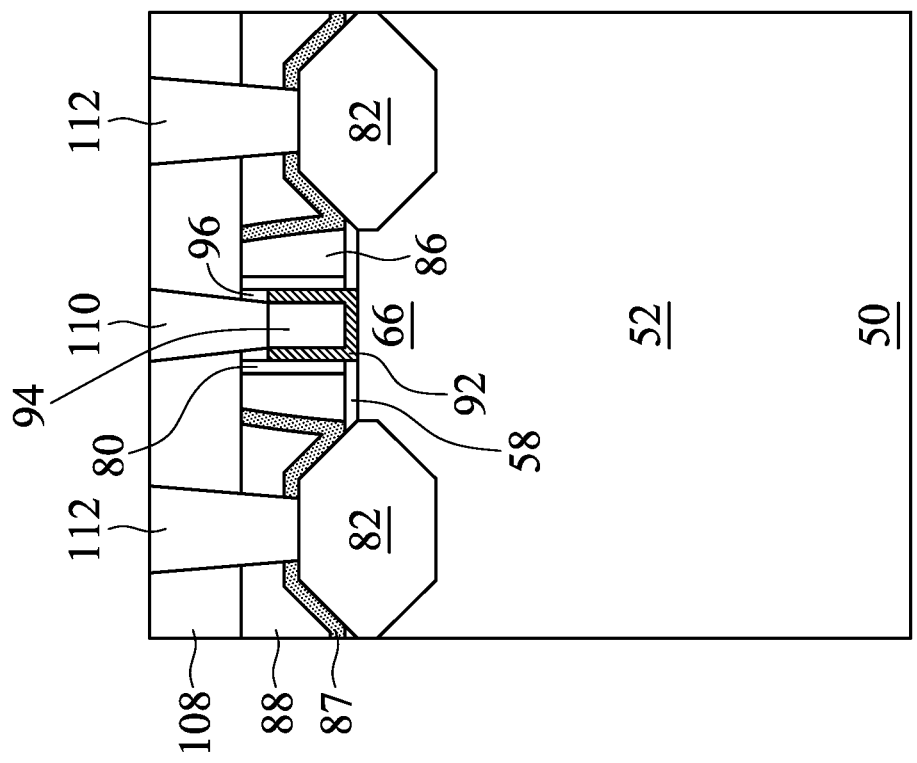
Figure 19A
Figure 19B

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-8, 9A-9C, 10, 11A, 11B, 12A, 12B, 13A-13D, 14A, 14B, 15A, 15B, 16A, 16B, 17A-17C, 18A, 18B, 19A, and 19B are cross-sectional views of intermediate stages in the manufacturing of FinFETs, in accordance with some embodiments.

DETAILED DESCRIPTION

Figure 1:
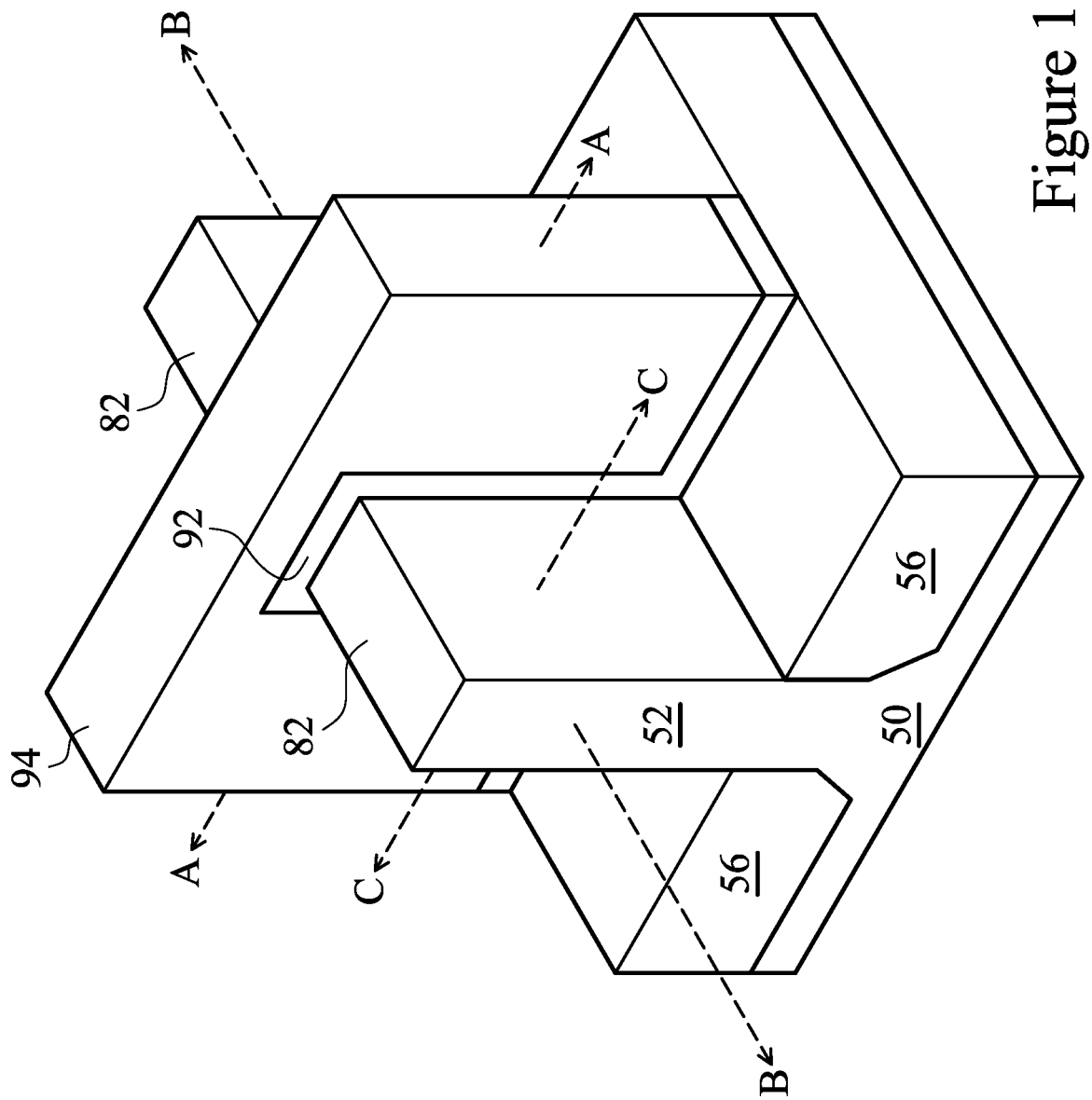
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first feature and the second feature are formed in direct contact, and may also include embodiments in which additional features may be formed between the first feature and the second feature, such that the first feature and the second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming improved dummy gate layers. A dummy gate layer may be formed by depositing a seed layer over a dummy dielectric layer, then depositing the dummy gate layer in a bottom-up deposition process. The dummy dielectric layer may comprise a material such as silicon oxide and the seed layer may comprise a material such as amorphous silicon or polysilicon. Precursors for the dummy gate layer may include chlorine-based silanes, which may be used to selectively deposit the material of the dummy gate layer on the seed layer, without the material being deposited on the dummy dielectric layer. Forming the dummy gate layer according to the processes provided may reduce or eliminate seams and/or voids in the dummy gate layer and bending in semiconductor fins over which the dummy gate layer is formed. Semiconductor devices formed according to the processes provided have fewer device defects and improved performance.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to the semiconductor substrate alone or the semiconductor substrate in combination with the isolation regions. Additionally, although the fin 52 and the substrate 50 are illustrated as a single, continuous material, the fin 52 and/or the substrate 50 may comprise a single material or a plurality of materials. In this context, the fin 52 refers to the portion extending between the neighboring isolation regions 56.

A gate dielectric layer 92 is disposed along sidewalls and over a top surface of the fin 52, and a gate electrode 94 is disposed over the gate dielectric layer 92. Epitaxial source/drain regions 82 are disposed in opposite sides of the fin 52 with respect to the gate dielectric layer 92 and the gate electrode 94. FIG. 1 further illustrates reference cross-sections that are used in later figures. Cross-section A-A is along a longitudinal axis of the gate electrode 94 and in a direction, for example, perpendicular to the direction of current flow between the epitaxial source/drain regions 82 of the FinFET. Cross-section B-B is perpendicular to cross-section A-A and is along a longitudinal axis of the fin 52 and in a direction of, for example, a current flow between the epitaxial source/drain regions 82 of the FinFET. Cross-section C-C is parallel to cross-section A-A and extends through a source/drain region of the FinFET. Subsequent figures refer to these reference cross-sections for clarity.

Some embodiments described herein are discussed in the context of FinFETs formed using a gate-last process. In other embodiments, a gate-first process may be used. Also, some embodiments contemplate aspects used in planar devices, such as planar FETs.

FIGS. 2 through 19B are cross-sectional views of intermediate stages in the manufacturing of FinFETs, in accordance with some embodiments. FIGS. 2 through 10 illustrate reference cross-section A-A illustrated in FIG. 1, except for multiple fins/FinFETs. FIGS. 11A, 12A, 13A, 14A, 15A, 16A, 17A, 18A, and 19A are illustrated along reference cross-section A-A illustrated in FIG. 1, and FIGS. 11B, 12B, 13B, 14B, 15B, 16B, 17B, 17C, 18B, and 19B are illustrated along a similar cross-section B-B illustrated in FIG. 1, except for multiple fins/FinFETs. FIGS. 13C and 13D are illustrated along reference cross-section C-C illustrated in FIG. 1, except for multiple fins/FinFETs.

Figure 2:
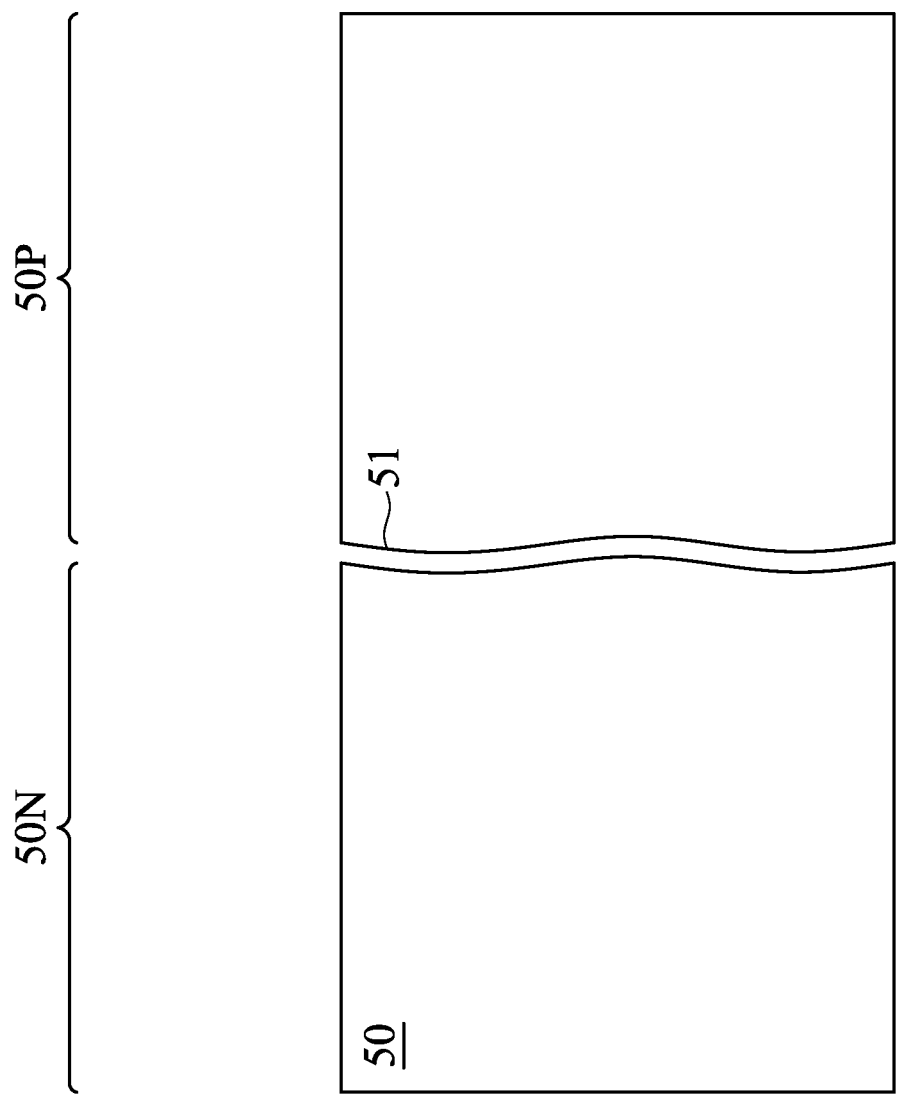

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N may be for forming n-type devices, such as NMOS transistors (e.g., n-type FinFETs). The region 50P may be for forming p-type devices, such as PMOS transistors (e.g., p-type FinFETs). The region 50N may be physically separated from the region 50P (as illustrated by divider 51), and any number of device features (e.g., other active devices, doped regions, isolation structures, or the like) may be disposed between the region 50N and the region 50P.

Figure 3:
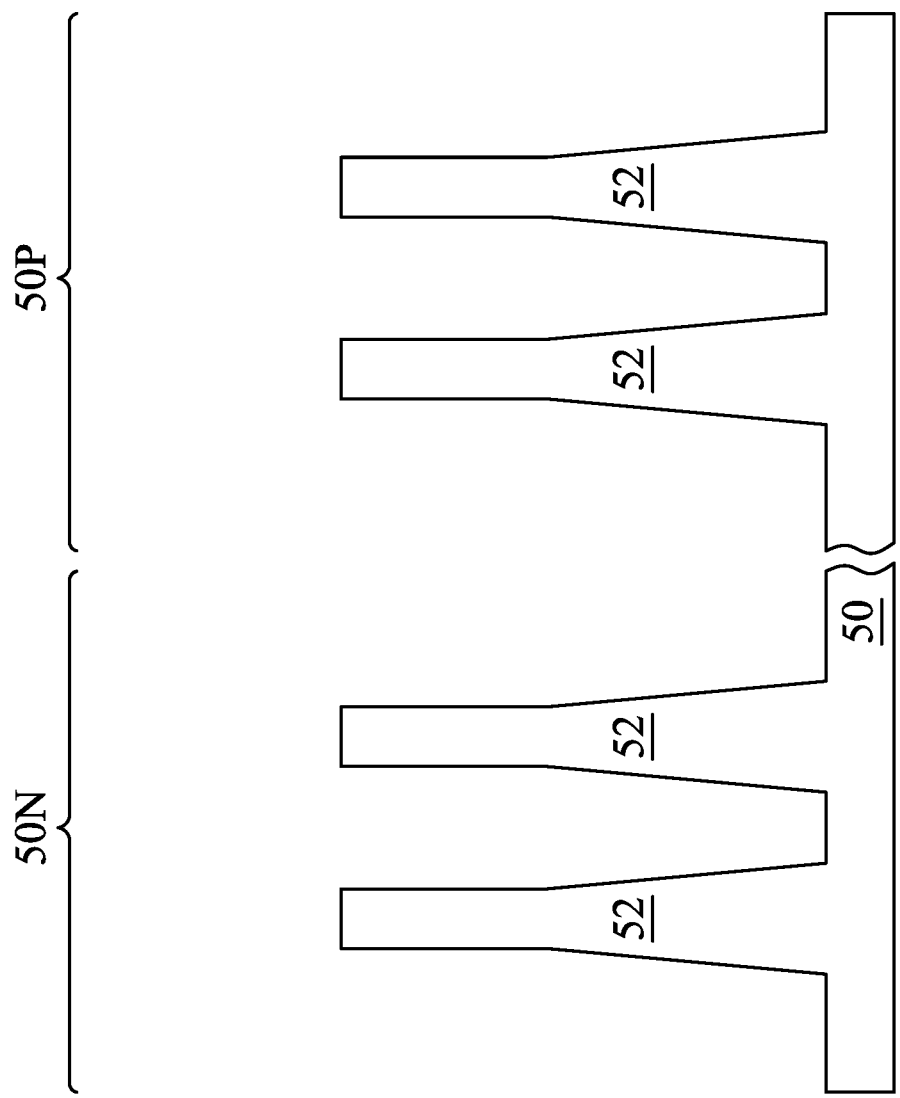

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), a neutral beam etch (NBE), the like, or a combination thereof. The etching may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
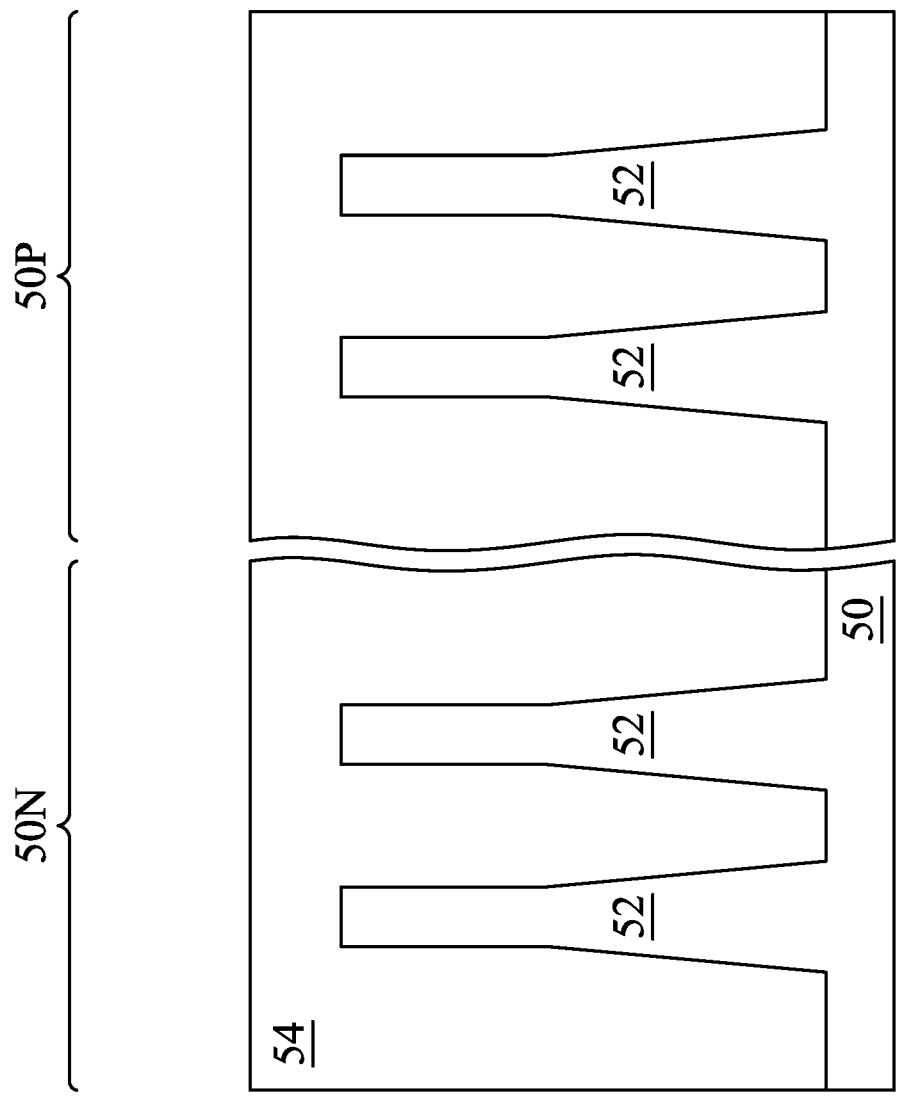

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not separately illustrated) may first be formed along a surface of the substrate 50 and the fins 52. Thereafter, a fill material, such as the materials discussed above for the insulation material 54 may be formed over the liner.

Figure 5:
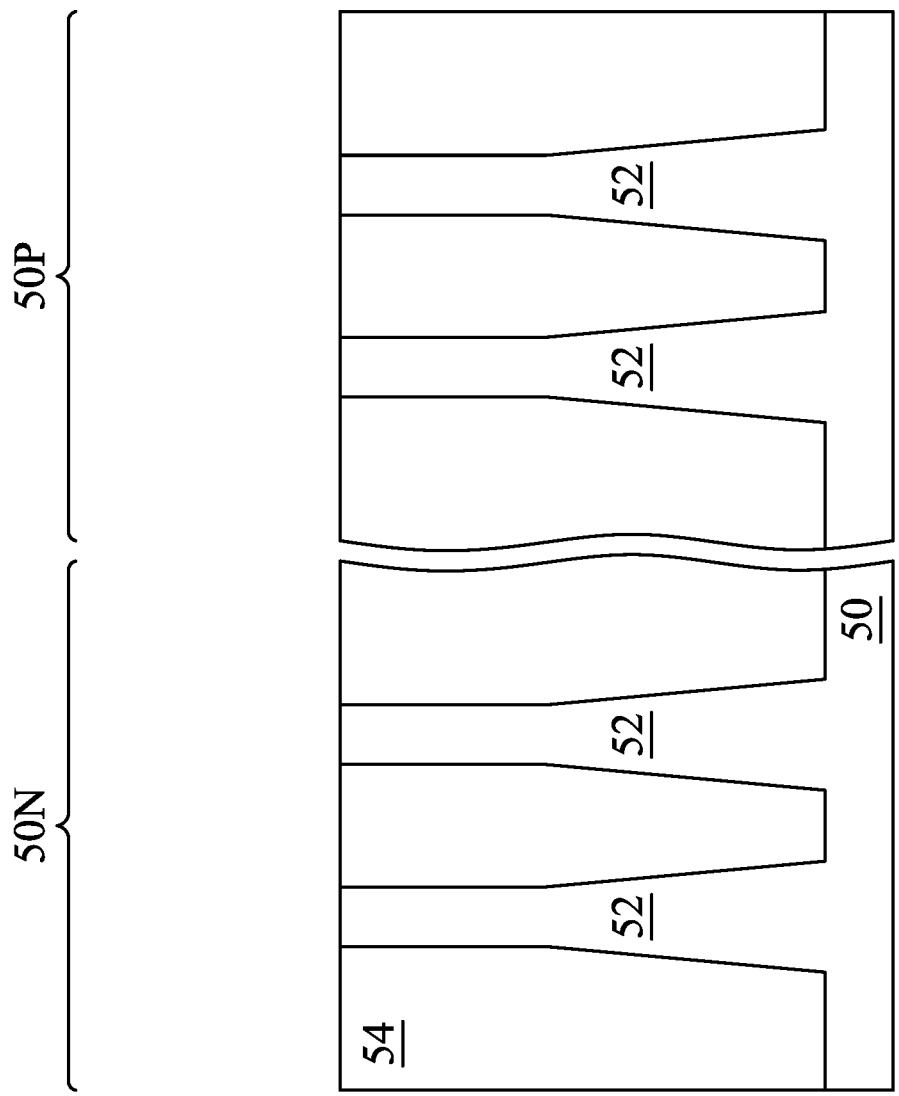

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
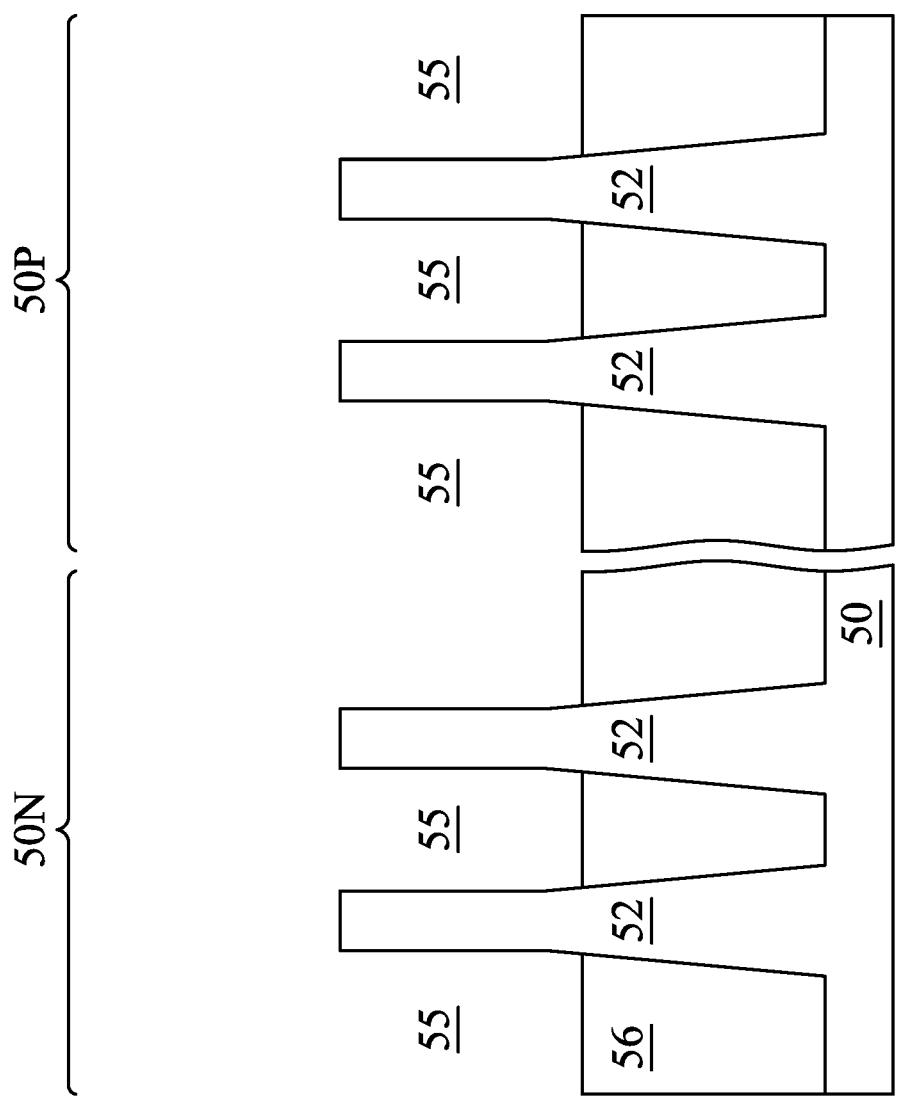

In FIG. 6, the insulation material 54 is recessed to form shallow trench isolation (STI) regions 56. The insulation material 54 is recessed such that upper portions of the fins 52 in the region 50N and in the region 50P protrude from between neighboring STI regions 56. Further, the top surfaces of the STI regions 56 may have a flat surface as illustrated, a convex surface, a concave surface (such as a dished surface), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., an etching process that etches the material of the insulation material 54 at a faster rate than the material of the fins 52). For example, an oxide removal using, for example, dilute hydrofluoric (dHF) acid may be used.

As illustrated in FIG. 6, trenches 55 may be formed between adjacent fins 52. Each of the trenches 55 may have a bottom surface defined by a top surface of a respective STI region 56 and side surfaces defined by sidewalls of the respective fins 52. In various embodiments, the trenches 55 may have an aspect ratio from about 3 to about 9, such as about 6. The term "aspect ratio" refers to a ratio of a height of a particular feature to a width of the particular feature. The trenches 55 may have heights equal to the heights of the fins 52 and widths equal to the widths of the STI regions 56 disposed between adjacent fins 52.

The process described with respect to FIGS. 2 through 6 is just one example of how the fins 52 may be formed. In some embodiments, the fins may be formed by an epitaxial growth process. For example, a dielectric layer may be formed over a top surface of the substrate 50, and trenches may be etched through the dielectric layer to expose the underlying substrate 50. Homoepitaxial structures may be epitaxially grown in the trenches, and the dielectric layer may be recessed such that the homoepitaxial structures protrude from the dielectric layer to form fins. Additionally, in some embodiments, heteroepitaxial structures may be used for the fins 52. For example, the fins 52 in FIG. 5 may be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer may be formed over a top surface of the substrate 50, and trenches may be etched through the dielectric layer. Heteroepitaxial structures may then be epitaxially grown in the trenches using a material different from the substrate 50, and the dielectric layer may be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the region 50N (e.g., the NMOS region) different from the material in the region 50P (e.g., the PMOS region). In various embodiments, upper portions of the fins 52 may be formed from silicon-germanium ($Si_xGe_{1-x}$, where x may be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 52 and the STI regions 56 in the region 50N. The photoresist is patterned to expose the region 50P (e.g., the PMOS region) of the substrate 50. The photoresist may be formed by using a spin-on technique and may be patterned using acceptable photolithography techniques. Once the photoresist is patterned, an n-type impurity implant is performed in the region 50P, and the photoresist may act as a mask to substantially prevent n-type impurities from being implanted into the region 50N (e.g., the NMOS region). The n-type impurities may be phosphorus, arsenic, antimony, or the like implanted in the region to a concentration of equal to or less than $10^{18}$ atoms/cm$^3$, such as between about $10^{16}$ atoms/cm$^3$ and about $10^{18}$ atoms/cm$^3$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N (e.g., the NMOS region) of the substrate 50. The photoresist may be formed by using a spin-on technique and may be patterned using acceptable photolithography techniques. Once the photoresist is patterned, a p-type impurity implant may be performed in the region 50N, and the photoresist may act as a mask to substantially prevent p-type impurities from being implanted into the region 50P (e.g., the PMOS region). The p-type impurities may be boron, boron fluoride, indium, or the like implanted in the region to a concentration of equal to or less than $10^{18}$ atoms/cm$^3$, such as between about $10^{16}$ atoms/cm$^3$ and about $10^{18}$ atoms/cm$^3$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
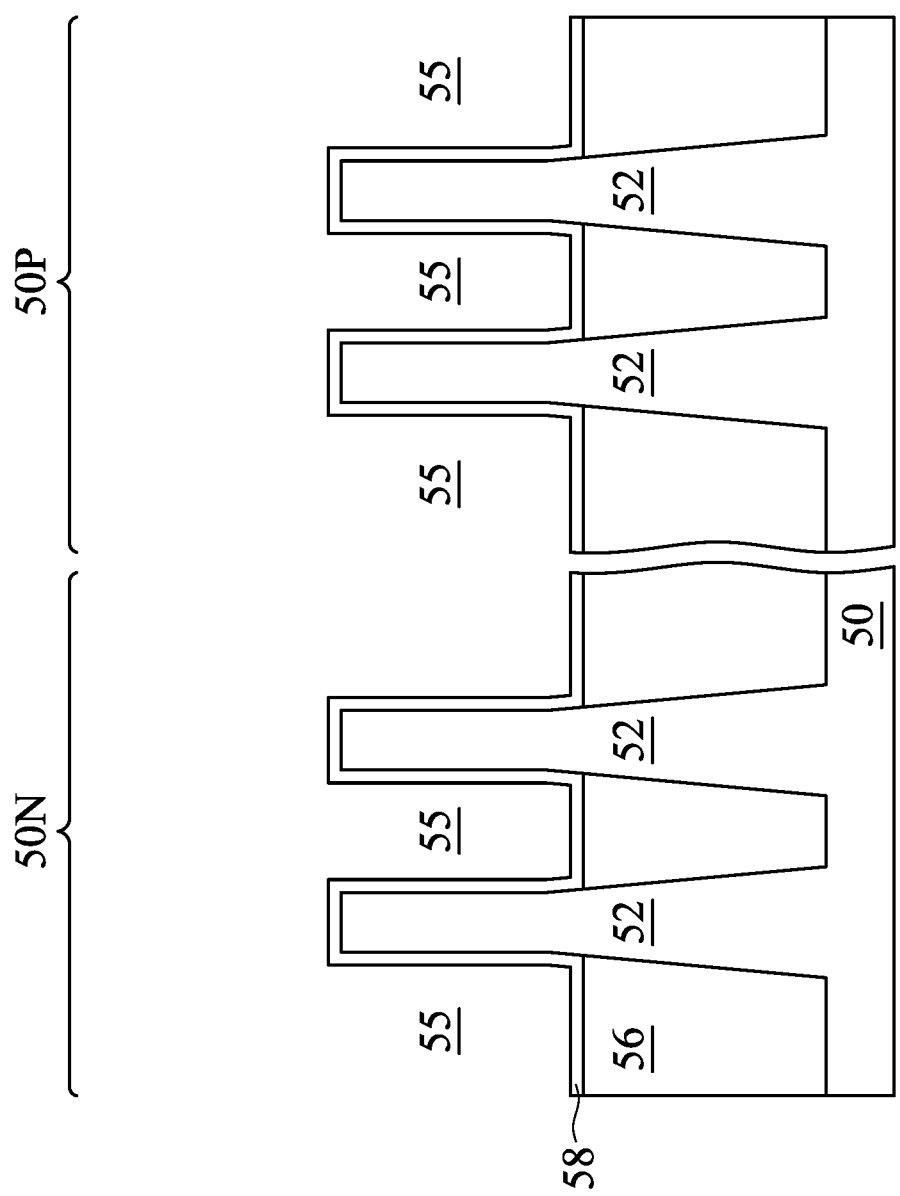

In FIG. 7, a dummy dielectric layer 58 is conformally formed over the substrate 50 covering the fins 52 and exposed surfaces of the STI regions 56. The dummy dielectric layer 58 may be, for example, silicon oxide, silicon nitride, a combination thereof, or the like, and may be thermally and/or chemically grown on the fins 52, or conformally deposited, such as by plasma-enhanced chemical vapor deposition (PECVD), atomic layer deposition (ALD), or any suitable deposition technique. It is noted that the dummy dielectric layer 58 is shown covering the fins 52 and the STI regions 56 for illustrative purposes only. In some embodiments, the dummy dielectric layer 58 may be deposited such that the dummy dielectric layer 58 covers the fins 52 only, without extending between the fins 52 over the STI regions 56.

Figure 8:
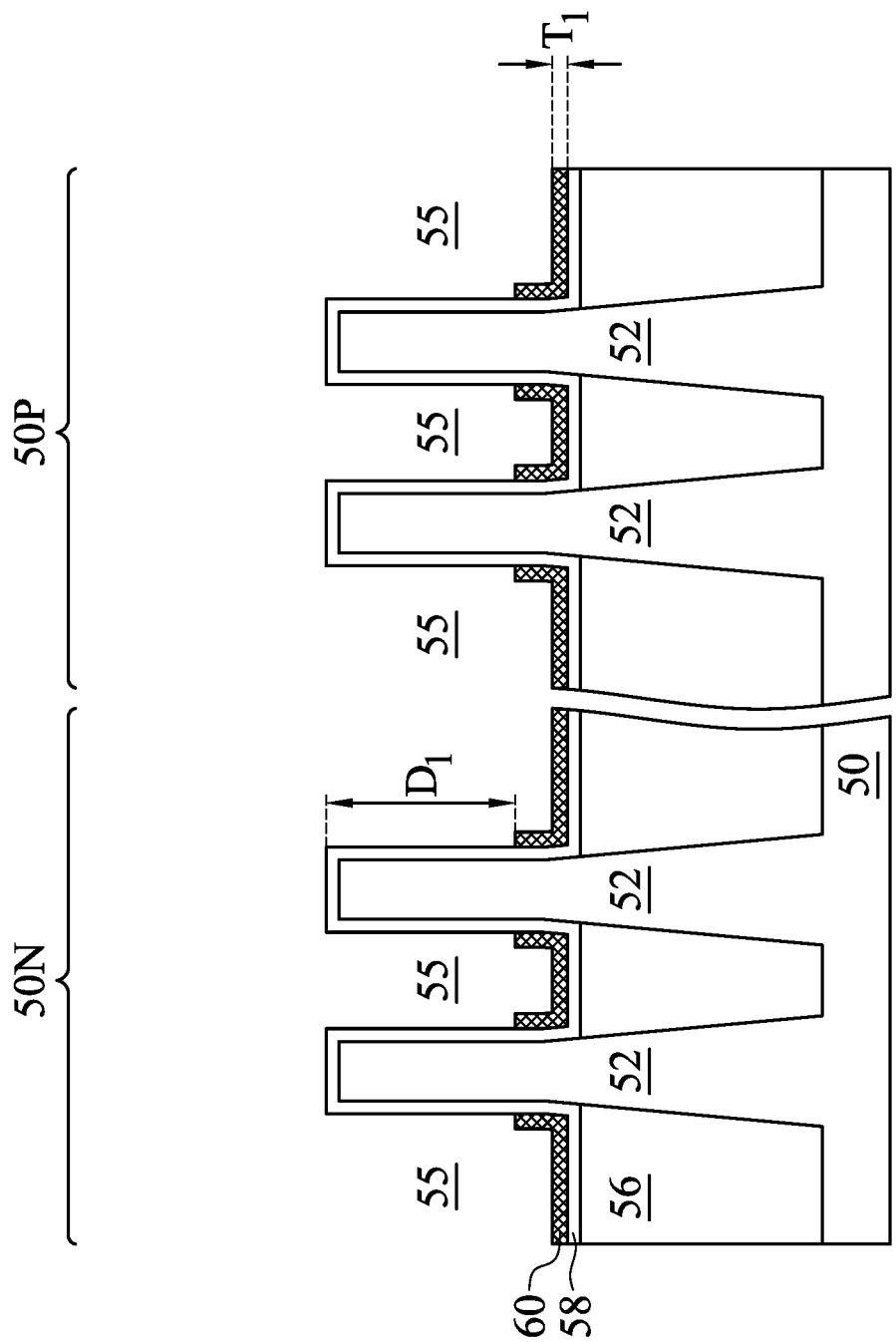

In FIG. 8, a seed layer 60 is formed over the dummy dielectric layer 58. The seed layer 60 may be formed to aid in a bottom-up growth of a subsequently deposited dummy gate layer (such as the dummy gate layer 62, discussed below in reference to FIGS. 9A-9C). The seed layer 60 may be chosen depending on the material of the dummy gate layer 62. In embodiments in which the dummy gate layer 62 includes silicon (e.g., polysilicon, amorphous silicon (a-Si), or the like), the seed layer 60 may be a silicon-containing film. In some embodiments, the seed layer 60 may include polysilicon or amorphous silicon. The seed layer 60 may be formed by a process including multiple deposition and etching cycles (referred to as a deposit-etch-deposit process or DED process), which may be carried out in a processing chamber. The material of the seed layer 60 may be deposited by a conformal deposition process such as remote plasma CVD (RPCVD), low-pressure CVD (LPCVD), CVD, PECVD, ALD, plasma-enhanced ALD (PEALD), or any suitable deposition process.

In an embodiment in which the seed layer 60 is deposited by CVD (e.g., RPCVD), a silicon-containing precursor may be used during the deposition process to form the seed layer 60. Suitable silicon-containing precursors may include silanes or the like. The silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). The silicon-containing precursors may be supplied at a flowrate from about 50 sccm to about 500 sccm, such as about 200 sccm.

In a further embodiment in which the seed layer is deposited by ALD (e.g., PEALD) and CVD (e.g., LPCVD), the seed layer 60 may be formed by depositing a monolayer (not separately illustrated) and depositing the remainder of the seed layer 60 over the monolayer. The monolayer may be deposited using a precursor such as di(isopropylamino) silane (DIPAS, $C_6H_{17}NSi$) or the like. The remainder of the seed layer 60 may be deposited using a precursor such as a silane having the formula $Si_xH_{(2x+2)}$. The flowrate for the precursors for depositing the monolayer and the remainder of the seed layer 60 may be from about 50 sccm to about 2,000 sccm, such as about 450 sccm.

The silicon-containing precursors may be mixed with additional gases that act as carrier gases, reactive gases, or both. For example, the additional gases may include hydrogen ($H_2$), nitrogen ($N_2$), argon (Ar), combinations thereof, or the like. The additional gases may be supplied at a flowrate from about 10 slm to about 40 slm, such as about 25 slm.

The processing chamber may be maintained at a temperature from about 400° C. to about 500° C., such as about 450° C., during the deposition of the seed layer 60. The processing chamber may further be maintained at a pressure from about 1 Torr to about 100 Torr, such as about 50 Torr, during the deposition of the seed layer 60.

The material of the seed layer 60 may then be etched by a suitable etching process. The etching process may be performed in situ, in the same processing chamber as the deposition process, or in a processing chamber different from that of the deposition process. The etching process may be performed using an etchant gas (e.g., a halogen-containing etchant gas), which may include chlorine ($Cl_2$), hydrogen chloride (HCl), fluorine ($F_2$), combinations thereof, or the like. In embodiments in which CVD (e.g., RPCVD) is used to deposit the seed layer 60, the etchant gas may be supplied to the processing chamber at a rate from about 1 slm to about 10 slm, such as about 5 slm. In further embodiments in which CVD (e.g., LPCVD) is used to deposit the seed layer 60, the etchant gas may be supplied to the processing chamber at a rate from about 0.2 slm to about 5 slm, such as about 0.7 slm.

The etchant gas may be mixed with additional gases that act as carrier gases, reactive gases, or both. For example, the additional gases may include hydrogen ($H_2$), nitrogen ($N_2$), argon (Ar), combinations thereof, or the like. The additional gases may be supplied at a flowrate from about from about 5 slm to about 20 slm, such as about 12.5 slm.

In embodiments in which the seed layer 60 is deposited by CVD (e.g., RPCVD) and the etchant gas includes hydrogen chloride, the processing chamber may be maintained at a temperature from about 500° C. to about 600° C., such as about 550° C. The processing chamber may be maintained at a pressure from about 1 Torr to about 500 Torr, such as about 200 Torr during the etching process. In embodiments in which the seed layer 60 is deposited by CVD (e.g., RPCVD) and the etchant gas includes chlorine, the processing chamber may be maintained at a temperature from about 300° C. to about 400° C., such as about 350° C. The processing chamber may be maintained at a pressure from about 1 Torr to about 500 Torr, such as about 200 Torr during the etching process. In an embodiment in which the seed layer 60 is deposited by CVD (e.g., LPCVD) and the etchant gas includes hydrogen chloride, the processing chamber may be maintained at a temperature from about 300° C. to about 500° C., such as about 400° C. The processing chamber may be maintained at a pressure from about 0.1 Torr to about 3 Torr, such as about 0.3 Torr during the etching process.

The etching process may remove portions of the seed layer 60 disposed on top surfaces and upper sidewalls of the fins 52 at a rate greater than the etching process removes portions of the seed layer 60 disposed at the bottom of the trenches 55. For example, due to the aspect ratio of the trenches 55, the etchant gas may not penetrate to bottom portions of the trenches 55 as readily as top portions such that the top portions are etched to a greater extent than the bottom portions. Following each of the deposition processes, the etching process may be performed for a duration sufficient to completely remove the seed layer 60 from the top surfaces and the upper sidewalls of the dummy dielectric layer 58. In various embodiments, the seed layer 60 may be removed from the dummy dielectric layer 58 to a depth $D_1$ from about 30 nm to about 60 nm below a top surface of the dummy dielectric layer 58.

The DED process may be repeated until the seed layer 60 reaches a sufficient thickness. For example, the DED process may be repeated until a thickness $T_1$ of the seed layer 60 along a bottom surface of the trench 55 reaches from about 0.5 nm to about 15 nm, such as about 3 nm. In various embodiments, the number of cycles of the DED process performed to form the seed layer 60 may be from 1 to 6.

Forming the seed layer 60 using the DED process allows for the seed layer 60 to be formed along bottom surfaces of the trenches 55, without being formed on the top surfaces and the upper sidewalls of the fins 52. As illustrated in FIG. 8 portions of the dummy dielectric layer 58 disposed on the sidewalls and the top surfaces of the fins 52 may be exposed after forming the seed layer 60. As will be discussed in greater detail below, this allows for the dummy gate layer 62 to be formed by a bottom-up deposition, which helps to reduce or eliminate seams or voids in the dummy gate layer 62.

Figure 9A:
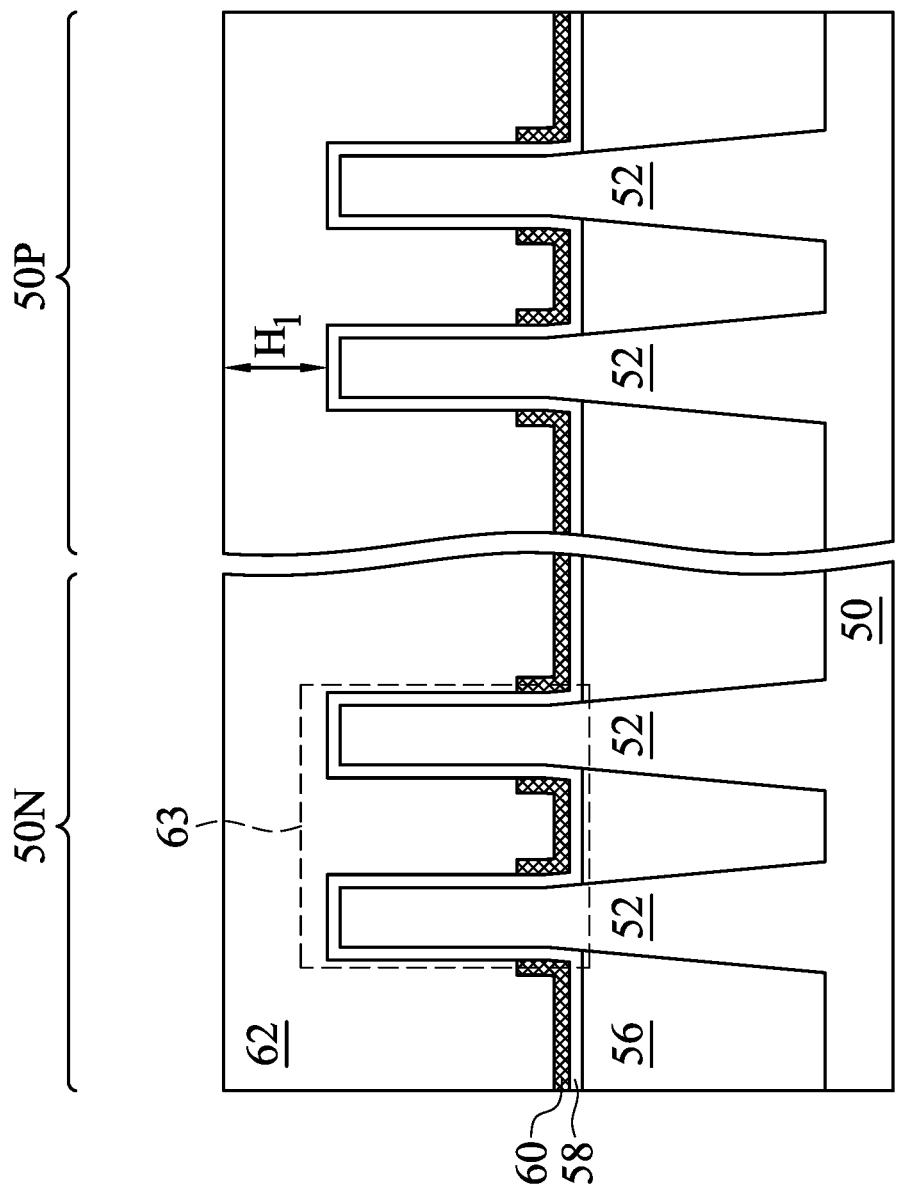

In FIG. 9A, a dummy gate layer 62 is formed over the seed layer 60 and the dummy dielectric layer 58. The dummy gate layer 62 may be formed of a material such as polysilicon, amorphous silicon, or the like. The dummy gate layer 62 may be selectively deposited on the seed layer 60. In some embodiments, the dummy gate layer 62 may be deposited by CVD (e.g., RPCVD, LPCVD, or the like), ALD, or the like with the deposition recipe being adjusted to achieve the selective deposition. Through the selective deposition, the material of the dummy gate layer 62 is deposited on the seed layer 60, without being deposited on the dummy dielectric layer 58. This deposition process creates bottom-up growth of the dummy gate layer 62, which prevents any voids or seams from being formed in the dummy gate layer 62 between the fins 52. The bottom-up deposition process may be performed in situ, in the same processing chamber as the deposition process for the seed layer 60, or in a processing chamber different from that of the deposition process for the seed layer 60.

In an embodiment in which the dummy gate layer 62 is deposited by CVD, precursors for the bottom-up deposition process used to form the dummy gate layer 62 may include halogenated silanes or the like. In specific embodiments, the bottom-up deposition precursors may include chlorine-based silanes, such as monochlorosilane ($SiH_3Cl$, MCS), dichlorosilane ($Si_2H_2Cl_2$, DCS), trichlorosilane ($SiHCl_3$, TCS), combinations thereof, or the like. Using the chlorine-based silanes for the bottom-up deposition precursors may improve the deposition selectivity between the seed layer 60 and the dummy dielectric layer 58. In some embodiments in which the dummy gate layer 62 is deposited by CVD (e.g., RPCVD), the bottom-up deposition process for the dummy gate layer 62 may be carried out with the bottom-up deposition precursors being supplied to the processing chamber at a flowrate from about 50 sccm to about 800 sccm, such as about 400 sccm. In further embodiments in which the dummy gate layer 62 is deposited by CVD (e.g., LPCVD), the bottom-up deposition process for the dummy gate layer 62 may be carried out with the bottom-up deposition precursors being supplied to the processing chamber at a flowrate from about 300 sccm to about 3,000 sccm, such as about 2,000 sccm.

The bottom-up deposition precursors may be mixed with additional gases that act as carrier gases, reactive gases, or both. For example, the additional gases may include hydrogen ($H_2$), nitrogen ($N_2$), argon (Ar), combinations thereof, or the like. The additional gases may be supplied at a flowrate from about from about 5 slm to about 20 slm, such as about 12.5 slm.

In embodiments in which the dummy gate layer 62 is deposited by CVD (e.g., RPCVD), the processing chamber may be maintained at a temperature from about 500° C. to about 700° C., such as about 600° C., and a pressure from about 1 Torr to about 200 Torr, such as about 100 Torr, during the bottom-up deposition process. The bottom-up deposition process may continue for a period from about 500 seconds to about 8,000 seconds. In further embodiments in which the dummy gate layer 62 is deposited by CVD (e.g., LPCVD), the processing chamber may be maintained at a temperature from about 500° C. to about 700° C., such as about 550° C., and a pressure from about 0.1 Torr to about 10 Torr, such as about 4 Torr, during the bottom-up deposition process. The bottom-up deposition process may continue for a period from about 0.5 hours to about 30 hours, such as about 10 hours. The bottom-up deposition process may proceed until a height $H_1$ of the dummy gate layer 62 above top surfaces of the dummy dielectric layer is from about 50 nm to about 250 nm. As illustrated in FIG. 9A, the dummy gate layer 62 may fill the trenches 55 (illustrated in FIG. 8) and extend over the fins 52. Following the bottom-up deposition process, the dummy gate layer 62 may be planarized using a process such as a CMP.

Forming the dummy gate layer 62 according to the above-described bottom-up deposition process allows for the dummy gate layer 62 to be formed without seams or voids between the fins 52. If seams and/or voids are present in the dummy gate layer 62, defects may be caused in the subsequent removal of the dummy gate layer and in the formation of a replacement gate structure. As such, avoiding seams and/or voids in the dummy gate layer 62 reduces defects in subsequently formed devices and increases wafer-per-hour (WPH) throughput of completed devices. The bottom-up deposition process may also reduce or eliminate bending of the fins 52 during the deposition of the dummy gate layer 62 as compared with conventional deposition processes. This further reduces device defects and improves device performance.

Although not separately illustrated, an etch stop layer and a sacrificial layer may be deposited over the dummy gate layer 62 and then removed using a process such as CMP, which planarizes the top surface of the dummy gate layer 62. The etch stop layer may be deposited over the dummy gate layer 62 using a process such as CVD, ALD, or the like and the sacrificial layer may be deposited over the etch stop layer using a process such as CVD, ALD, or the like. The etch stop layer may be, for example, silicon oxide, silicon nitride, a combination thereof, or the like. The sacrificial layer may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. In a specific embodiment, the etch stop layer may comprise silicon nitride (SiN) and the sacrificial layer may comprise polysilicon. The etch stop layer and the sacrificial layer may be formed over the dummy gate layer 62 to improve the planarization efficiency of the dummy gate layer 62 and to improve the planarity of the dummy gate layer 62.

Figure 9B:
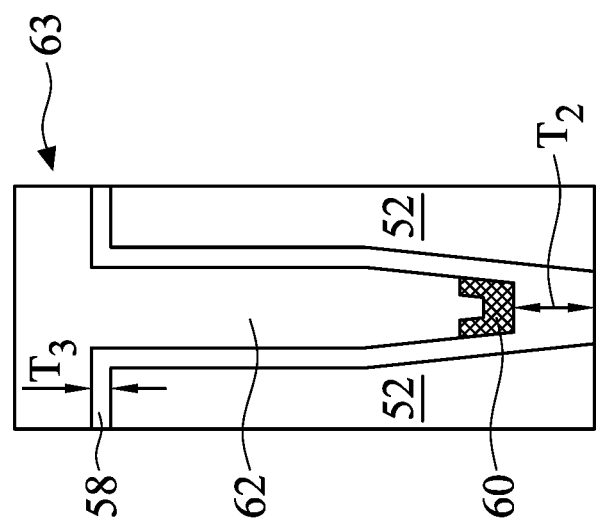
Figure 9C:
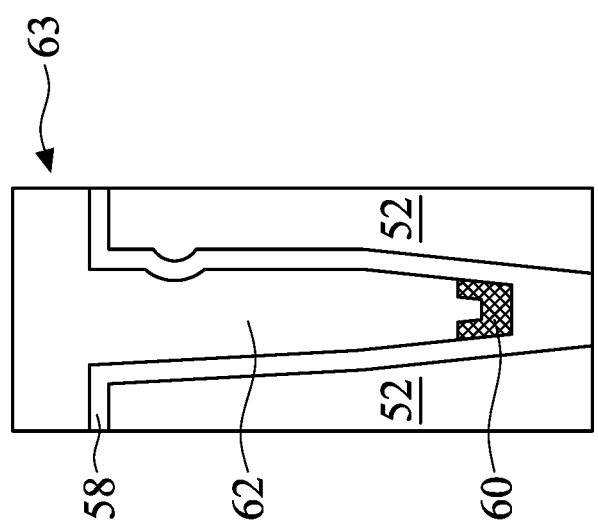

FIGS. 9B and 9C illustrate detailed views of region 63 of the structure illustrated in FIG. 9A, in accordance with some embodiments. FIGS. 9A and 9B illustrate embodiments in which the portions of the dummy gate layer 62 disposed between the fins 52 have different aspect ratios. For example, the portions of the dummy gate layer 62 disposed between the fins 52 have a greater aspect ratio in the embodiment illustrated in FIG. 9B than the embodiment illustrated in FIG. 9A. FIG. 9B further illustrates that the dummy dielectric layer 58 may have a greater thickness at the bottom of the trenches than on top surfaces of the fins 52. For example, a thickness $T_2$ of the dummy dielectric layer 58 at the bottom of the trenches 55 may be from about 5 nm to about 100 nm, while a thickness $T_3$ of the dummy dielectric layer 58 on top surfaces of the fins 52 is from about 2 nm to about 5 nm.

FIG. 9C illustrates a particular embodiment in which process variations lead to defects in the fins 52. For example, process variations may cause the fins 52 to bend, as evidenced by the left fin 52 illustrated in FIG. 9C. Process variations may also cause the fins 52 to have overhangs, as evidenced by the right fin 52 illustrated in FIG. 9C. Depositing the dummy gate layer 62 using the bottom-up deposition process, as opposed to a conventional conformal deposition process, prevents portions of the dummy gate layer 62 from merging. As such, the dummy gate layer 62 may be deposited in the trenches 55 without seams or voids even in cases in which the fins 52 are bent or have overhangs.

Figure 10:
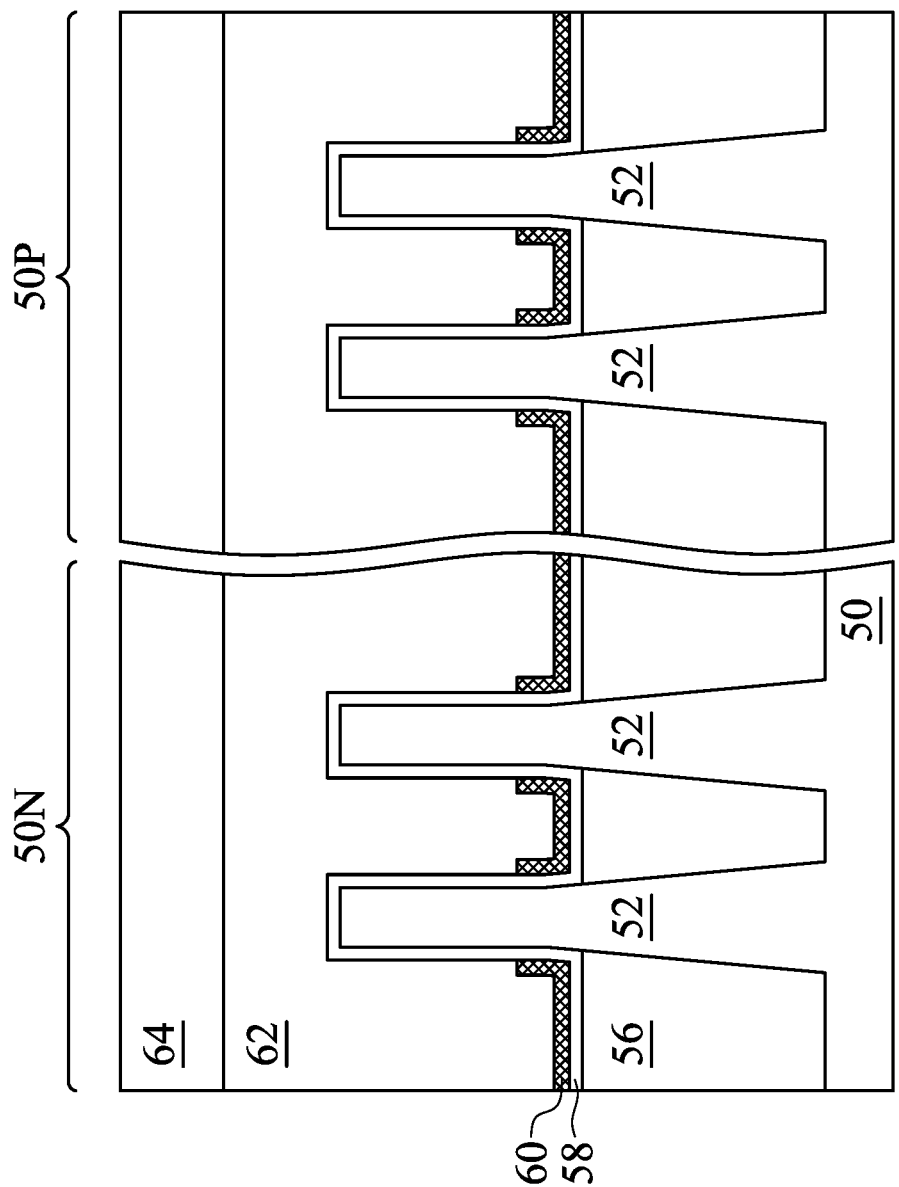

In FIG. 10, a mask layer 64 is deposited over the dummy gate layer 62. The mask layer 64 may include, for example, silicon nitride, silicon oxynitride, or the like. In the example illustrated in FIG. 10, a single dummy gate layer 62 and a single mask layer 64 are formed across the region 50N and the region 50P; however, in other embodiments, different dummy gate layers and mask layers each having one or more layers may be formed in the region 50N and the region 50P.

FIGS. 11A through 19B illustrate various additional steps in the manufacturing of embodiment devices. FIGS. 11A through 19B illustrate features in either of the region 50N and the region 50P. For example, the structures illustrated in FIGS. 11A through 19B may be applicable to both the region 50N and the region 50P. Differences (if any) in the structures of the region 50N and the region 50P are described in the text accompanying each figure.

Figure 11B:
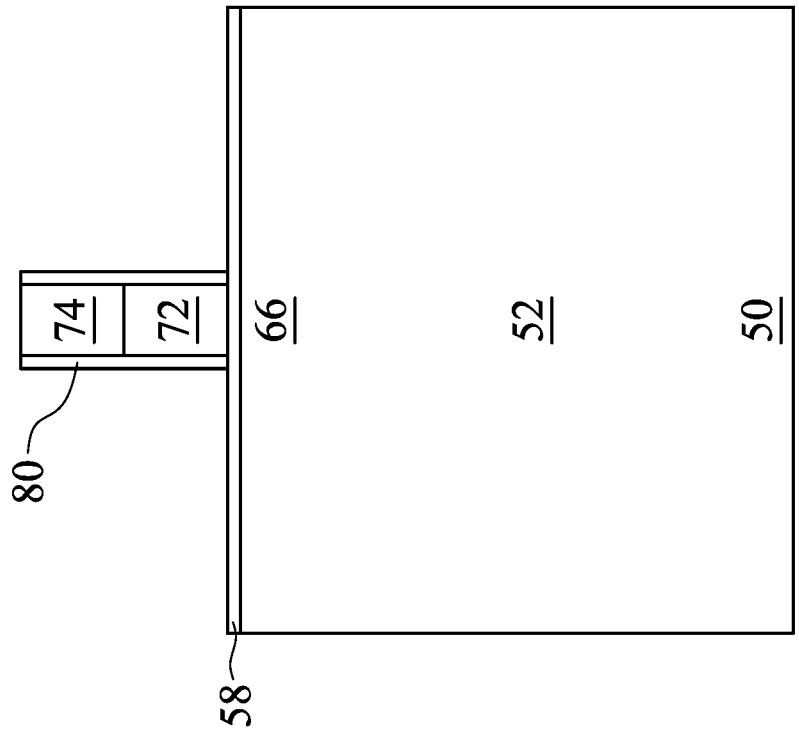
Figure 11A:
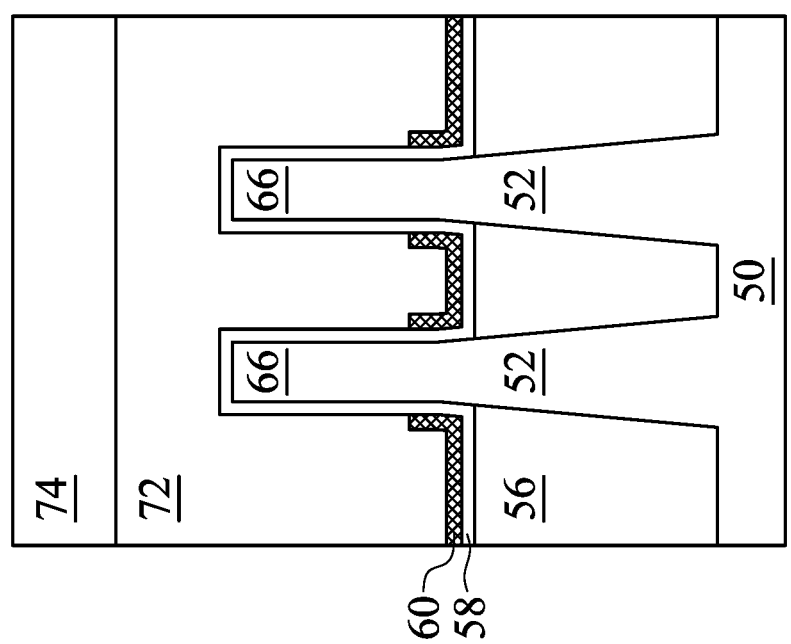

In FIGS. 11A and 11B, the mask layer 64 (see FIG. 10) may be patterned using acceptable photolithography and etching techniques to form masks 74. The pattern of the masks 74 then may be transferred to the dummy gate layer 62 to form dummy gates 72. In some embodiments (not separately illustrated), the pattern of the masks 74 may also be transferred to the dummy dielectric layer 58 by an acceptable etching technique. The dummy gates 72 cover respective channel regions 66 of the fins 52. The pattern of the masks 74 may be used to physically separate each of the dummy gates 72 from adjacent dummy gates 72. The dummy gates 72 may also have a lengthwise direction substantially perpendicular to the lengthwise direction of the respective fins 52.

Further in FIGS. 11A and 11B, gate seal spacers 80 may be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not separately illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ atoms/cm$^3$ to about $10^{19}$ atoms/cm$^3$. An anneal may be used to repair implant damage and to activate the implanted impurities.

Figure 12A:
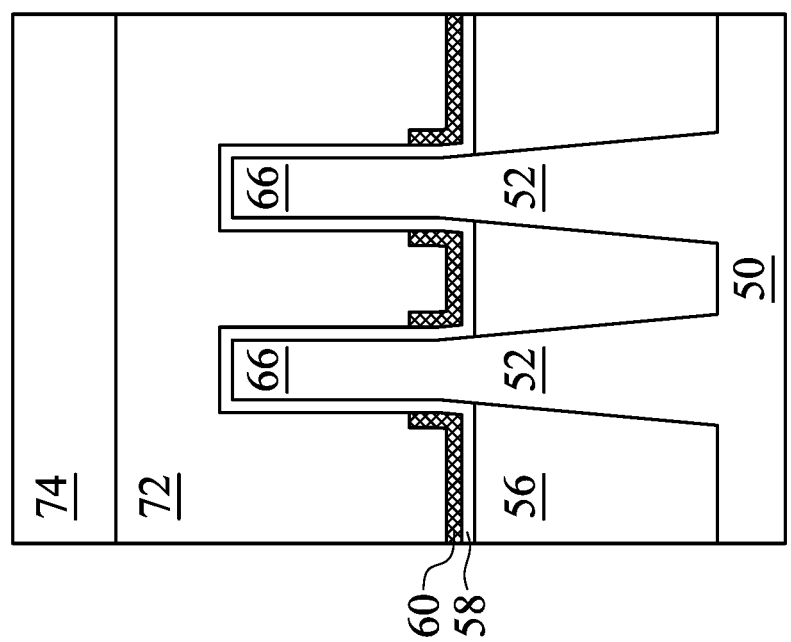
Figure 12B:
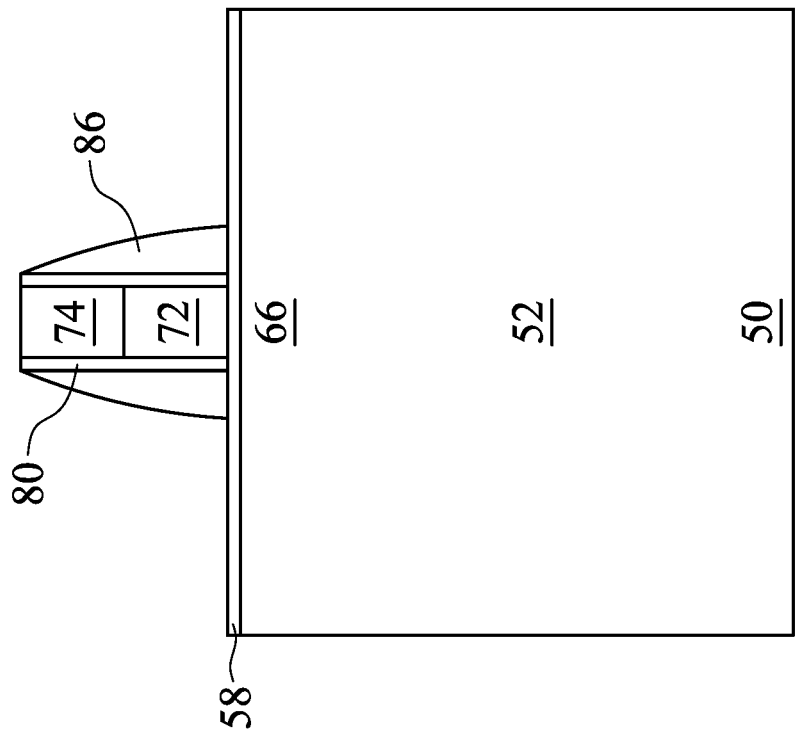

In FIGS. 12A and 12B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers 80, additional spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 13B:
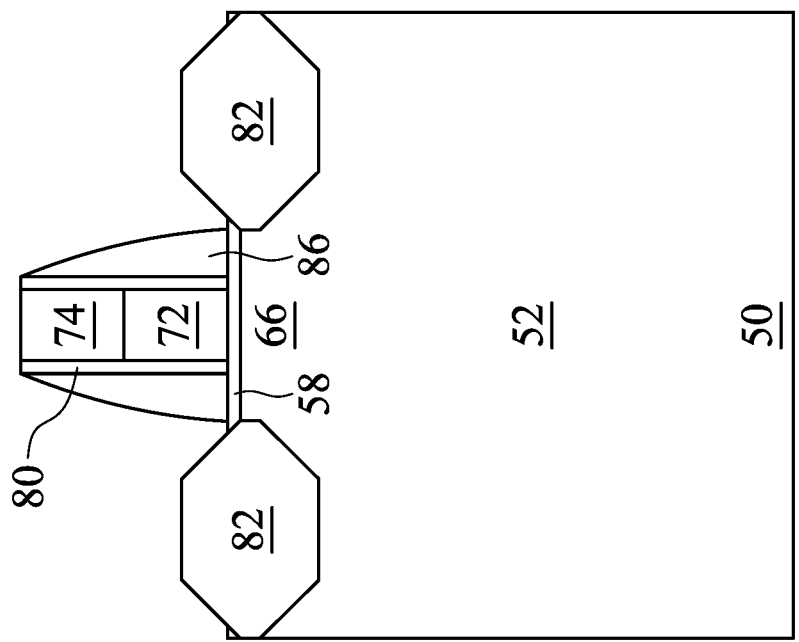
Figure 13A:
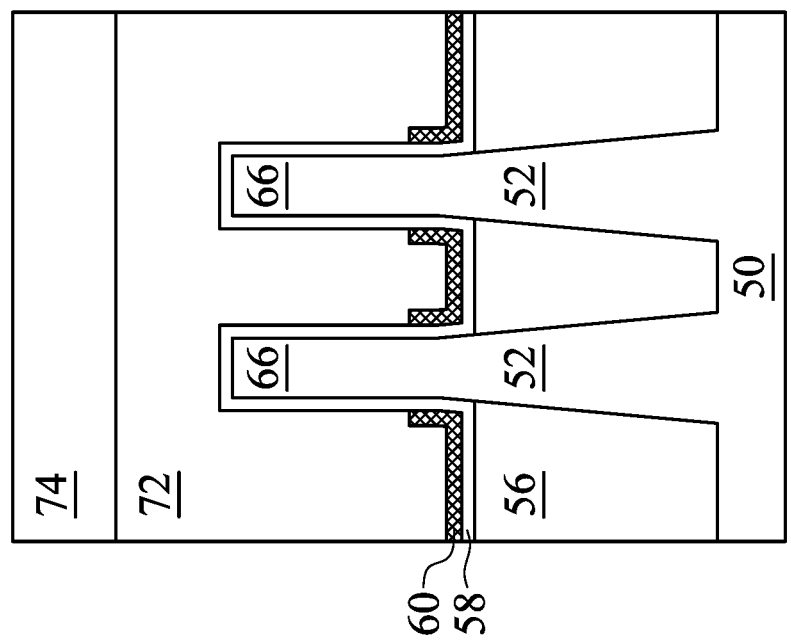
Figure 13D:
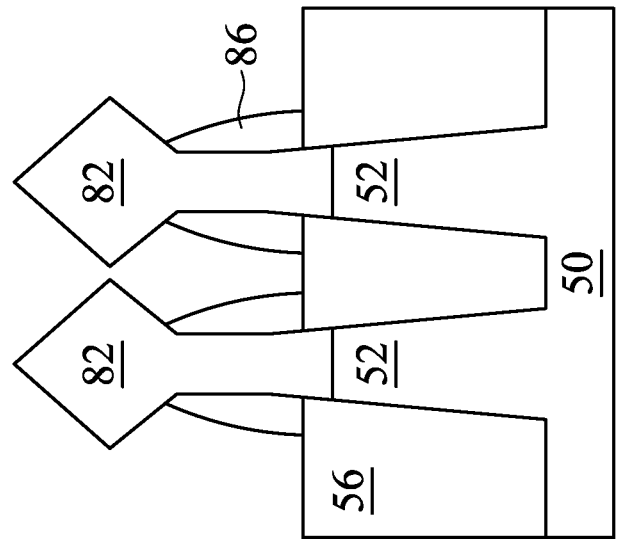
Figure 13C:
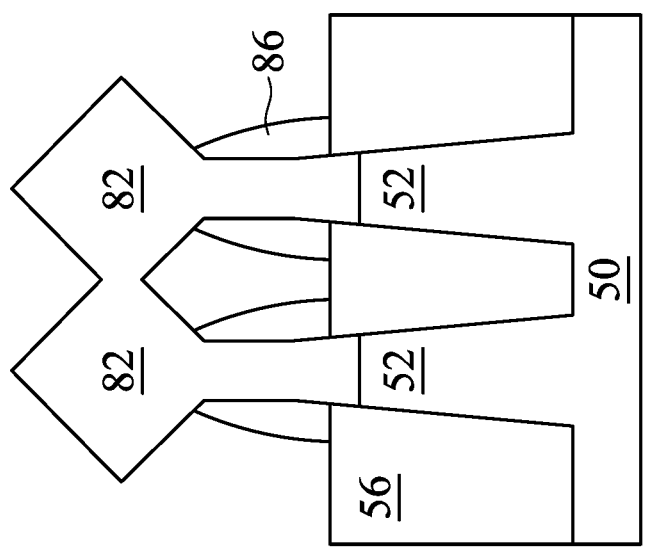

In FIGS. 13A and 13B epitaxial source/drain regions 82 are formed in the fins 52 to exert stress in the respective channel regions 66, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N (e.g., the NMOS region) may be formed by masking the region 50P (e.g., the PMOS region) and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 66, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P (e.g., the PMOS region) may be formed by masking the region 50N (e.g., the NMOS region) and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 66, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ atoms/cm$^3$ and about $10^{21}$ atoms/cm$^3$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 13C. In other embodiments, adjacent epitaxial source/drain regions 82 remain separated after the epitaxy process is completed as illustrated by FIG. 13D. In the embodiments illustrated in FIGS. 13C and 13D, the gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 14B:
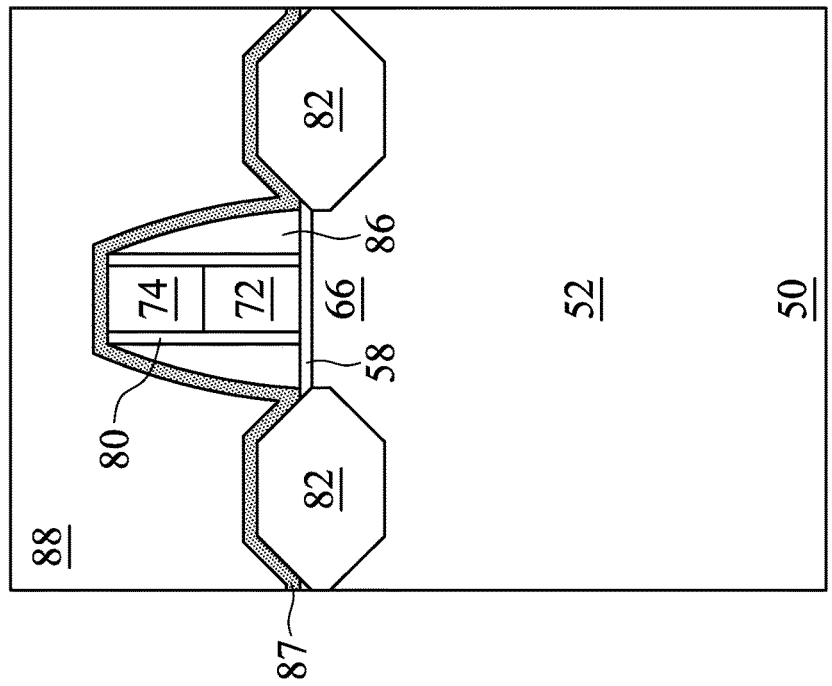
Figure 14A:
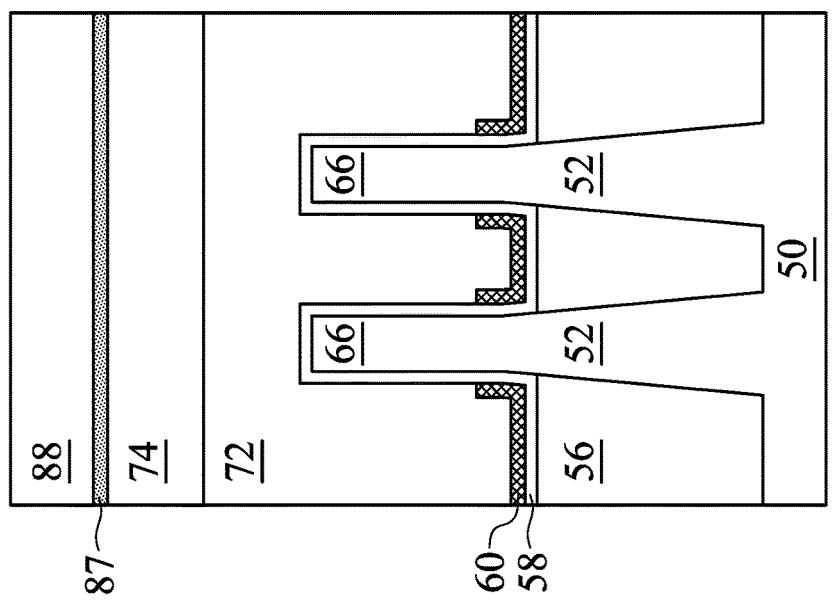

In FIGS. 14A and 14B, a first interlayer dielectric (ILD) 88 is deposited over the structure illustrated in FIGS. 13A and 13B. The first ILD 88 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 15B:
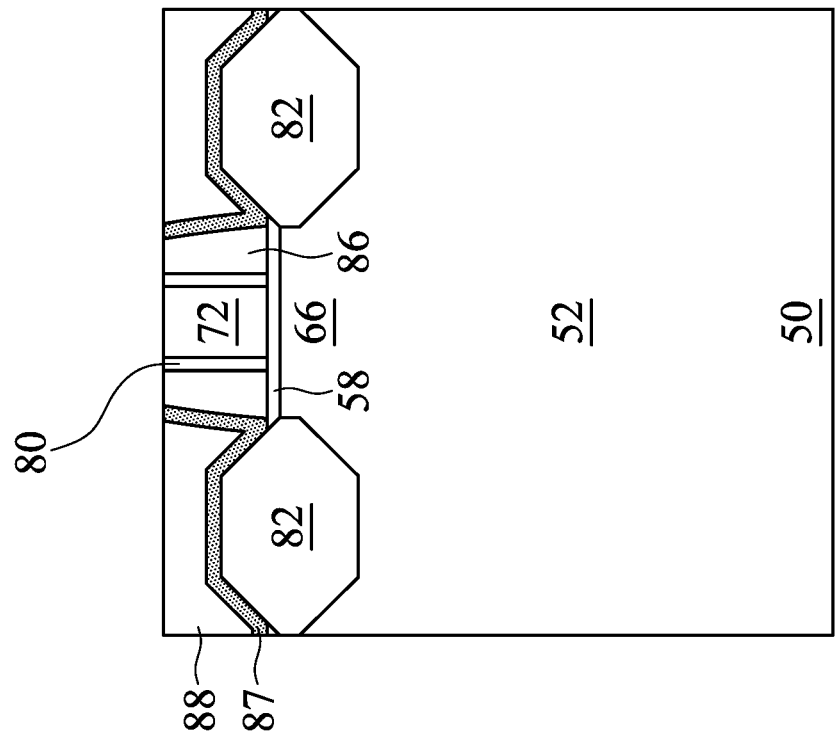
Figure 15A:
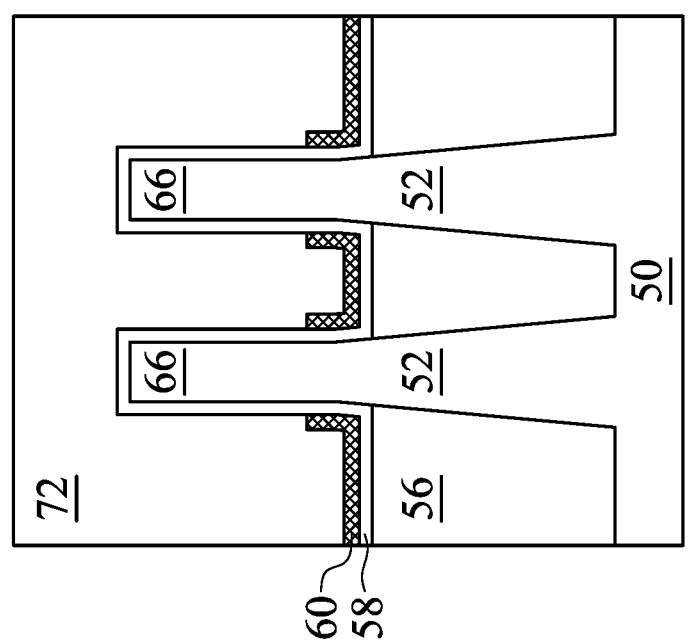

In FIGS. 15A and 15B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, the CESL 87 and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74, the gate seal spacers 80, the gate spacers 86, and the CESL 87.

Figure 16B:
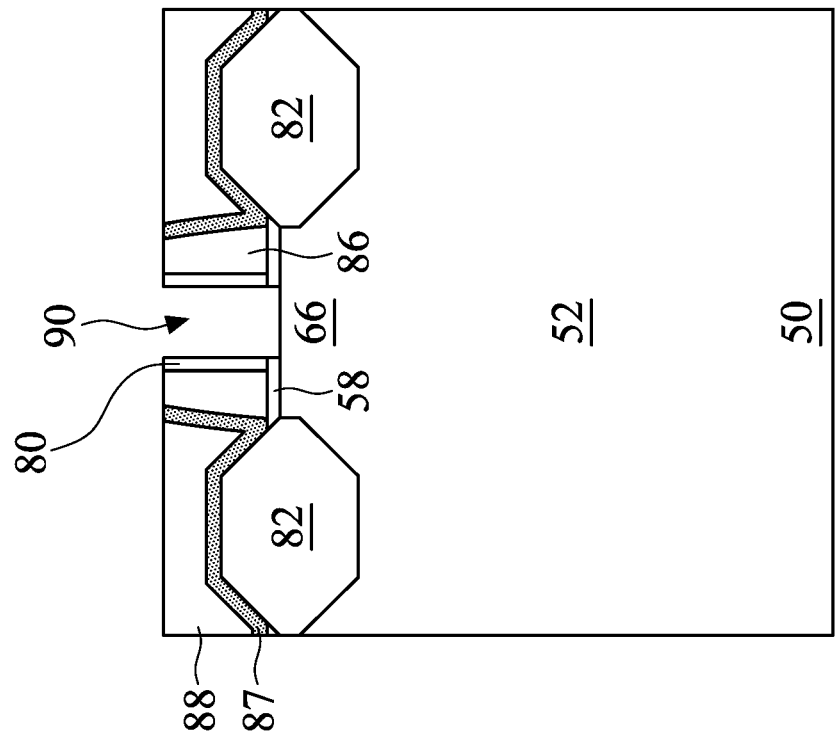
Figure 16A:
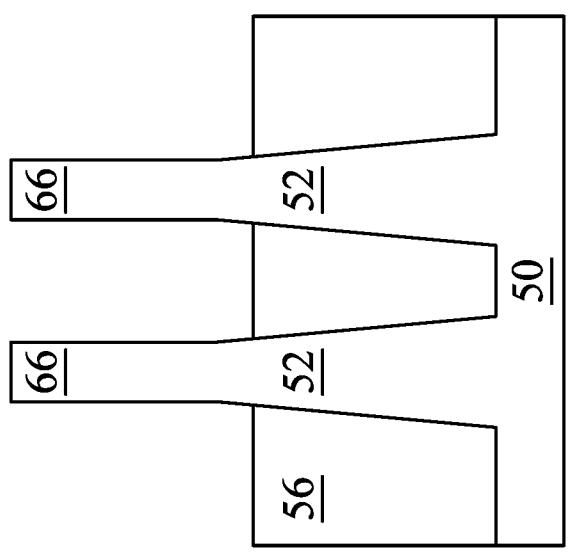

In FIGS. 16A and 16B, the dummy gates 72, and the masks 74 if present, are removed in an etching step(s), so that recesses 90 are formed. Portions of the dummy dielectric layer 58 in the recesses 90 may also be removed. In some embodiments, only the dummy gates 72 are removed and the dummy dielectric layer 58 remains and is exposed by the recesses 90. In some embodiments, the dummy dielectric layer 58 is removed from the recesses 90 in a first region of a die (e.g., a core logic region) and remains in the recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each of the recesses 90 may expose and/or overly a channel region 66 of a respective fin 52. Each of the channel regions 66 is disposed between neighboring pairs of the epitaxial source/drain regions 82. During the removal, the dummy dielectric layer 58 may be used as an etch stop layer when the dummy gates 72 are etched. The dummy dielectric layer 58 may then be optionally removed after the removal of the dummy gates 72.

In FIGS. 17A and 17B, gate dielectric layers 92 and gate electrodes 94 are formed for replacement gates. FIG. 17C illustrates a detailed view of region 89 of FIG. 17B. The gate dielectric layers 92 are deposited conformally in the recesses 90, such as on the top surfaces of the fins 52, the gate seal spacers 80, and the gate spacers 86 and on the sidewalls of the fins 52 and the gate seal spacers 80. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include molecular-beam deposition (MBD), ALD, PECVD, and the like. In embodiments where portions of the dummy dielectric layer 58 remain in the recesses 90, the gate dielectric layers 92 include a material of the dummy dielectric layer 58 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 17C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 66 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18B:
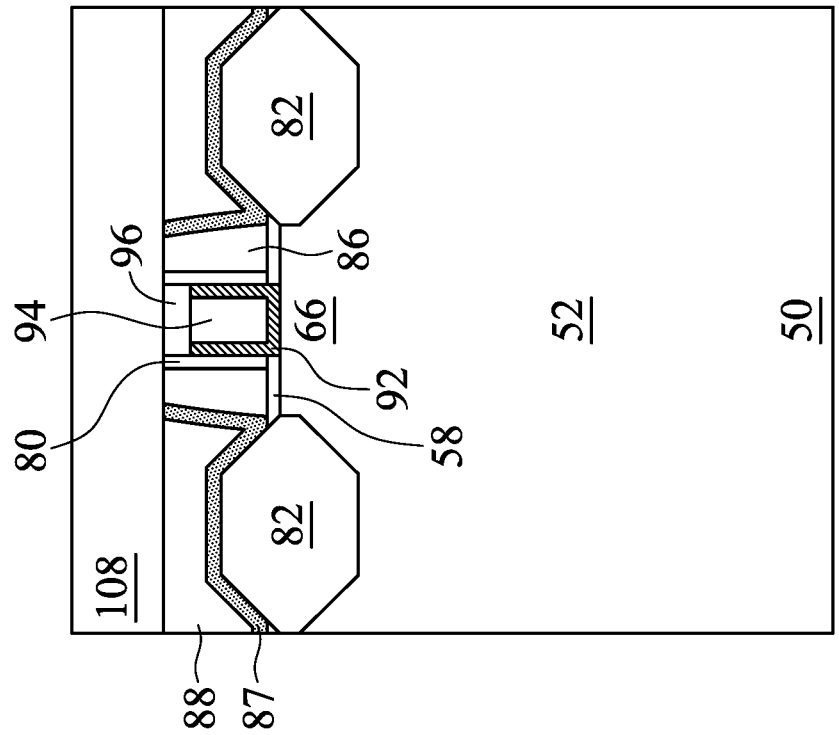
Figure 18A:
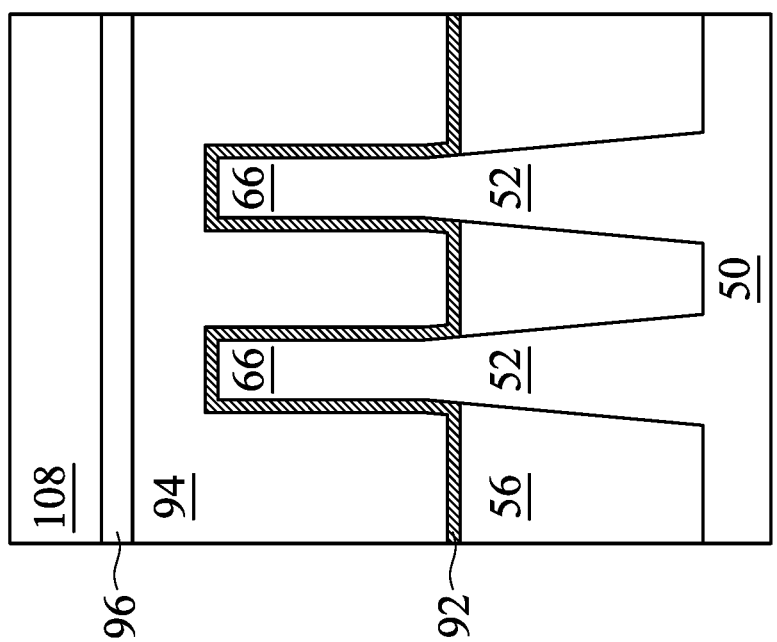

In FIGS. 18A and 18B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD, PECVD, or the like. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of the gate spacers 86, as illustrated in FIGS. 18A and 18B. A gate mask 96 comprising one or more layers of dielectric material, such as silicon nitride, silicon oxynitride, or the like, is filled in the recess, followed by a planarization process to remove excess portions of the dielectric material extending over the first ILD 88. Subsequently formed gate contacts (such as gate contacts 110, discussed below with respect to FIGS. 19A and 19B) penetrate through the gate mask 96 to contact the top surface of the recessed gate electrode 94.

In FIGS. 19A and 19B, gate contacts 110 and source/drain contacts 112 are formed through the second ILD 108 and the first ILD 88 in accordance with some embodiments. Openings for the source/drain contacts 112 are formed through the first ILD 88 and the second ILD 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and the gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and the gate contacts 110 may be formed in different processes, or may be formed in the same process. Although shown as being formed in the same cross-sections, it should be appreciated that each of the source/drain contacts 112 and the gate contacts 110 may be formed in different cross-sections, which may avoid shorting of the contacts.

As discussed above, forming the dummy gate layer 62 using a bottom-up deposition process allows for the dummy gate layer 62 to be formed without seams or voids and reduces bending of the fins 52 during the deposition process for forming the dummy gate layer 62. Forming semiconductor devices according to the above-described processes results in fewer defects, improved performance, and increased WPH throughput.

In accordance with an embodiment, a method includes depositing a first material in a trench, the trench being disposed between a first fin and a second fin; etching the first material to expose an upper portion of sidewalls of the trench; and depositing a second material on the first material without the second material being deposited on the exposed upper portion of the sidewalls of the trench. In an embodiment, the depositing the first material is performed using a conformal deposition process. In an embodiment, a first precursor for the depositing the first material includes disilane ($Si_2H_6$). In an embodiment, an etchant for the etching the first material includes hydrogen chloride (HCl). In an embodiment, an etchant for the etching the first material includes chlorine ($Cl_2$). In an embodiment, a second precursor for the depositing the second material includes dichlorosilane ($H_2SiCl_2$). In an embodiment, the method further includes forming a replacement gate, the forming the replacement gate including depositing the first material, etching the first material, and depositing the second material.

In accordance with another embodiment, a method includes forming fins extending from a substrate, a trench including sidewalls of the fins and a bottom surface extending between the sidewalls of the fins; depositing a first dielectric layer over the fins and in the trench; and forming a dummy gate layer over the first dielectric layer, the forming the dummy gate layer including depositing a seed layer over the first dielectric layer; etching the seed layer to expose portions of the first dielectric layer disposed on upper portions of the fins; and depositing a dummy gate material over the seed layer, the dummy gate material being selectively deposited on the seed layer. In an embodiment, the seed layer includes silicon and the first dielectric layer includes silicon oxide. In an embodiment, a halogen-containing etchant gas is used for the etching the seed layer. In an embodiment, the seed layer has a thickness from 0.5 nm to 15 nm before the depositing the dummy gate material. In an embodiment, an aspect ratio of the trench is from 3 to 9. In an embodiment, a precursor for the depositing the seed layer includes disilane ($Si_2H_6$). In an embodiment, a precursor for the depositing the dummy gate material includes dichlorosilane ($H_2Cl_2Si$).

In accordance with yet another embodiment, a method includes forming a trench interposed between a first fin and a second fin; forming a dielectric layer extending along sidewalls of the trench and upper surfaces of the first fin and the second fin; and forming a dummy gate over the dielectric layer, the forming the dummy gate including performing a plurality of first deposition cycles and a plurality of etch cycles to form a seed layer extending along a top surface of the dielectric layer disposed in a bottom portion of the trench, upper portions of the trench being free from the seed layer, and each of the first deposition cycles being followed by an etch cycle of the plurality of etch cycles; and after performing the plurality of first deposition cycles and the plurality of etch cycles, performing a second deposition cycle to form a dummy gate material over the seed layer, the dielectric layer, the first fin, and the second fin, the dummy gate material filling the trench, and the second deposition cycle selectively depositing the dummy gate material on the seed layer. In an embodiment, at least one of the first deposition cycles is performed at a temperature from 400° C. to 500° C. and a pressure from 1 Torr to 100 Torr. In an embodiment, at least one of the etch cycles is performed at a temperature from 300° C. to 400° C. and a pressure from 1 Torr to 500 Torr. In an embodiment, the second deposition cycle is performed at a temperature from 500° C. to 700° C. and a pressure from 1 Torr to 200 Torr. In an embodiment, a carrier gas used for the performing the plurality of first deposition cycles, the performing the plurality of etch cycles, and the performing the second deposition cycle includes hydrogen ($H_2$). In an embodiment, a flowrate of the carrier gas for the performing the plurality of first deposition cycles is from 10 slm to 40 slm, a flowrate of the carrier gas for the performing the plurality of etch cycles is from 5 slm to 20 slm, and a flowrate of the carrier gas for the performing the second deposition cycle is from 5 slm to 20 slm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first dielectric layer in a trench and over a first fin and a second fin, wherein the trench is disposed between the first fin and the second fin;
depositing a seed layer over the first dielectric layer;
etching the seed layer to expose a portion of the first dielectric layer disposed on an upper portion of sidewalls of the trench; and
depositing a dummy gate material on the seed layer, wherein the dummy gate material is selectively deposited on the seed layer.

2. The method of claim 1, wherein the depositing the seed layer is performed using a conformal deposition process.

3. The method of claim 1, wherein a first precursor for the depositing the seed layer comprises disilane ($Si_2H_6$).

4. The method of claim 1, wherein an etchant for the etching the seed layer comprises hydrogen chloride (HCl).

5. The method of claim 1, wherein an etchant for the etching the seed layer comprises chlorine ($O_2$).

6. The method of claim 1, wherein a second precursor for the depositing the dummy gate material comprises dichlorosilane ($H_2SiCl_2$).

7. The method of claim 1, further comprising forming a replacement gate, wherein the forming the replacement gate comprises depositing the seed layer, etching the seed layer, and depositing the dummy gate material.

8. A method comprising:
forming fins extending from a substrate, wherein a trench comprises sidewalls of the fins and a bottom surface extending between the sidewalls of the fins;
depositing a first dielectric layer over the fins and in the trench; and
forming a dummy gate layer over the first dielectric layer, wherein the forming the dummy gate layer comprises:
depositing a seed layer over the first dielectric layer;

etching the seed layer to expose portions of the first dielectric layer disposed on upper portions of the fins; and depositing a dummy gate material over the seed layer, wherein the dummy gate material is selectively deposited on the seed layer.

9. The method of claim 8, wherein the seed layer comprises silicon and the first dielectric layer comprises silicon oxide.

10. The method of claim 8, wherein a halogen-containing etchant gas is used for the etching the seed layer.

11. The method of claim 8, wherein the seed layer has a thickness from 0.5 nm to 15 nm before the depositing the dummy gate material.

12. The method of claim 8, wherein an aspect ratio of the trench is from 3 to 9.

13. The method of claim 8, wherein a precursor for the depositing the seed layer comprises disilane ($Si_2H_6$).

14. The method of claim 8, wherein a precursor for the depositing the dummy gate material comprises dichlorosilane ($H_2Cl_2Si$).

15. A method comprising:
forming a trench interposed between a first fin and a second fin;
forming a dielectric layer extending along sidewalls of the trench and upper surfaces of the first fin and the second fin; and
forming a dummy gate over the dielectric layer, wherein the forming the dummy gate comprises:
performing a plurality of first deposition cycles and a plurality of etch cycles to form a seed layer extending along a top surface of the dielectric layer disposed in a bottom portion of the trench, wherein upper portions of the trench are free from the seed layer, and wherein each of the first deposition cycles is followed by an etch cycle of the plurality of etch cycles; and
after performing the plurality of first deposition cycles and the plurality of etch cycles, performing a second deposition cycle to form a dummy gate material over the seed layer, the dielectric layer, the first fin, and the second fin, wherein the dummy gate material fills the trench, and wherein the second deposition cycle selectively deposits the dummy gate material on the seed layer.

16. The method of claim 15, wherein at least one of the first deposition cycles is performed at a temperature from 400° C. to 500° C. and a pressure from 1 Torr to wo Torr.

17. The method of claim 15, wherein at least one of the etch cycles is performed at a temperature from 300° C. to 400° C. and a pressure from 1 Torr to 500 Torr.

18. The method of claim 15, wherein the second deposition cycle is performed at a temperature from 500° C. to 700° C. and a pressure from 1 Torr to 200 Torr.

19. The method of claim 15, wherein a carrier gas used for the performing the plurality of first deposition cycles, the performing the plurality of etch cycles, and the performing the second deposition cycle comprises hydrogen ($H_2$).

20. The method of claim 19, wherein a flowrate of the carrier gas for the performing the plurality of first deposition cycles is from 10 slm to 40 slm, wherein a flowrate of the carrier gas for the performing the plurality of etch cycles is from 5 slm to 20 slm, and wherein a flowrate of the carrier gas for the performing the second deposition cycle is from 5 slm to 20 slm.

* * * * *